(12) United States Patent
Raatz et al.

(10) Patent No.: US 11,430,683 B2
(45) Date of Patent: Aug. 30, 2022

(54) CONVEYING DEVICE FOR CONVEYING AT LEAST ONE WAFER

(71) Applicant: Robert Bosch GmbH, Stuttgart (DE)

(72) Inventors: Heike Raatz, Stuttgart (DE); Bas Verhelst, Wijchen (NL); Joachim Frangen, Heilbronn (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/972,955

(22) PCT Filed: May 28, 2019

(86) PCT No.: PCT/EP2019/063849
§ 371 (c)(1),
(2) Date: Dec. 7, 2020

(87) PCT Pub. No.: WO2019/238416
PCT Pub. Date: Dec. 19, 2019

(65) Prior Publication Data
US 2021/0249291 A1 Aug. 12, 2021

(30) Foreign Application Priority Data

Jun. 14, 2018 (DE) .................... 10 2018 006 259.8

(51) Int. Cl.
*H01L 21/677* (2006.01)
*B65G 54/02* (2006.01)

(52) U.S. Cl.
CPC ........ *H01L 21/67709* (2013.01); *B65G 54/02* (2013.01); *H01L 21/67724* (2013.01); *H01L 21/67736* (2013.01); *B65G 2811/0668* (2013.01)

(58) Field of Classification Search
CPC ............ B65G 54/02; B65G 2811/0668; H01L 21/67724
See application file for complete search history.

(56) References Cited

U.S. PATENT DOCUMENTS 7,224,252 B2 * 5/2007 Meadow, Jr. .... A63B 21/00192
104/281
10,056,816 B2 * 8/2018 Lu .......................... H02K 41/03
(Continued)

FOREIGN PATENT DOCUMENTS

DE          199 60 321 A1     7/2001
DE     10 2014 225 171 A1     6/2016
(Continued)

OTHER PUBLICATIONS

International Search Report corresponding to PCT Application No. PCT/EP2019/063849, dated Sep. 5, 2019 (German and English language document) (7 pages).

*Primary Examiner* — Gerald McClain
(74) *Attorney, Agent, or Firm* — Maginot, Moore & Beck LLP

(57) ABSTRACT

A conveying device includes a transport body configured to carry or hold a wafer, and a stator relative to which the conveying device is designed to move the transport body at least two-dimensionally on a conveying surface. The stator includes several movably arranged actuating magnets, each of which is connected to the stator via an actuating element, and the actuating element is configured to change a position and/or an orientation of the connected actuating magnets relative to the stator. The transport body includes at least two stationary magnets which are connected to the transport body such that the stationary magnets are immovable relative to the transport body, and the stator and the transport body are magnetically coupled by the stationary magnets and the actuating magnets. The device conveys the transport body relative to the stator by controlled positioning and/or orientation of the actuating magnets via the actuating elements.

14 Claims, 26 Drawing Sheets

(56) References Cited

U.S. PATENT DOCUMENTS

| | | | |
|---|---|---|---|
| 2003/0021658 A1 | 1/2003 | Blonigan et al. | |
| 2003/0217668 A1* | 11/2003 | Fiske | B60L 13/04 104/282 |
| 2010/0238425 A1* | 9/2010 | Binnard | G03B 27/58 355/72 |
| 2016/0375534 A1 | 12/2016 | Park et al. | |
| 2017/0317569 A1 | 11/2017 | Lu et al. | |

FOREIGN PATENT DOCUMENTS

| | | |
|---|---|---|
| DE | 10 2016 224 951 A1 | 6/2018 |
| JP | S60-36222 A | 2/1985 |
| JP | 2012-19618 A | 1/2012 |

\* cited by examiner

CONVEYING DEVICE FOR CONVEYING AT LEAST ONE WAFER

This application is a 35 U.S.C. § 371 National Stage Application of PCT/EP2019/063849, filed on May 28, 2019, which claims the benefit of priority to Ser. No. DE 10 2018 006 259.8, filed on Jun. 14, 2018 in Germany, the disclosures of which are incorporated herein by reference in their entirety.

The present disclosure concerns a conveying device for conveying at least one wafer, and a method for its operation. Preferably, magnetic levitation is used for floating transport and/or positioning and/or orientation of the at least one wafer. The solution presented here may preferably be used in the field of semiconductor production.

BACKGROUND

In semiconductor production, often objects such as wafers must be transported or positioned. Conventionally, transport systems are used for this which move the wafer on fixed tracks or rails. Such fixed tracks or rails normally only allow a one-dimensional movement, which in particular has the disadvantage that the wafers are conveyed in an established order, and in particular it is not usually possible to bring a rear wafer ahead of a front one.

In addition, for wafer transport inside a so-called cluster tool, it is known to use a centrally arranged handling device which can convey each wafer in a radial direction (one-dimensionally) up to processing stations of the cluster tool arranged in a circle around the handling device. This previously conventional type of wafer transport inside the cluster tool however leads to restrictions in the design of the cluster tool.

It is therefore desirable to provide a conveying device which allows a more flexible conveying of at least one wafer, in particular up to a processing station and/or inside a processing station.

SUMMARY

According to disclosure, a conveying device is proposed for conveying at least one wafer, with at least one transport body, wherein the transport body is configured at least to carry or hold at least one wafer, and wherein the conveying device is configured to move the at least one transport body at least two-dimensionally on a conveying surface.

Advantageous embodiments are the subject of the description which follows.

A wafer is usually a disc, for example circular or square and around 1 mm thick, used in microelectronics, photovoltaics and/or microsystem engineering. These wafers or discs are normally made from mono- or polycrystalline (semiconductor) blanks known as ingots, and normally serve as a substrate (base plate) for electronic components, including for integrated circuits (IC or chip), micro-mechanical components and/or photoelectric coatings.

The transport body is configured to carry and/or hold at least one wafer. In this context, the at least one wafer may be positioned on the (top of the) transport body, below the transport body or next to the transport body. In addition, the transport body may also be configured to carry and/or hold a stack of several wafers. In this context, it is particularly preferred if the transport body is furthermore configured to extract individual wafers from the stack of wafers and where applicable insert them into the stack. The transport body may comprise one or more forks which are each configured to hold or carry at least one wafer or a stack of several wafers. Alternatively or cumulatively, the transport body may comprise a table (in the manner of a plate) which is configured such that at least one wafer or a stack of several wafers may be deposited thereon. In this context, it is particularly preferred if the table comprises a fixing element which is configured to fix (releasably) one or more wafers deposited on the table (during transport).

The conveying device is configured to move the at least one transport body at least two-dimensionally (or in some cases even three-dimensionally) on a conveying surface. In this context, it is particularly preferred if the conveying device is configured to move the at least one transport body along an at least two-dimensional or even three-dimensional conveying path (on the conveying surface). A two-dimensional movement is here distinguished in particular in that it takes place in one plane. In addition (as explained below), it is advantageous if the transport body is movable in six degrees of freedom.

The solution proposed here in particular allows a particularly advantageous transport system for semiconductor production, in which one or more wafers can be conveyed freely on a conveying surface or in a plane. The movement, here also described as two-dimensional, advantageously allows a more flexible conveying of at least one wafer, in particular up to a processing station and/or inside a processing station. This allows the further advantage that semiconductor production plants, in particular so-called cluster tools, can be designed better.

According to an advantageous embodiment, it is proposed that the conveying device is configured to convey the at least one transport body in a controlled floating fashion. In other words, this means in particular a contactless or touch-free conveying of the transport body. In this context, it is particularly preferred if the conveying device is formed in the manner of a magnetic transport system, or if the floating conveying is performed magnetically. A floating conveying is advantageous in particular in connection with clean rooms as are used in semiconductor production, since this may further reduce the risk of possible contamination of the clean rooms. A magnetic implementation is particularly advantageous in particular when conveying must take place under vacuum conditions. In particular outside such vacuum conditions, for example, compressed air systems may also be used, which e.g. provide an air cushion below the transport body.

According to a particularly preferred embodiment, the conveying device furthermore comprises a stator, wherein the conveying device is configured to convey the at least one transport body relative to the stator in controlled fashion. Here, the stator may have several movably arranged actuating magnets, each of which is connected to the stator via an actuating element, wherein the actuating element is configured to change a position and/or an orientation of the connected actuating magnets relative to the stator in controlled fashion; the at least one transport body comprises at least two stationary magnets which are connected to the transport body such that the at least two stationary magnets are immovable relative to the transport body; the stator and the at least one transport body are magnetically coupled by means of the at least two stationary magnets and the several actuating magnets; and the conveying device is configured to convey the at least one transport body relative to the stator by controlled positioning and/or orientation of the several actuating magnets by means of the actuating elements. Alternatively, the at least one transport body may comprise several movably arranged actuating magnets, each of which is connected to the transport body via an actuating element, wherein the actuating element is configured to change a position and/or an orientation of the connected actuating magnets relative to the transport body in controlled fashion; the stator comprises at least two stationary magnets which are connected to the stator such that the at least two stationary magnets are immovable relative to the stator; the at least one transport body and the stator are magnetically coupled by means of the at least two stationary magnets and the several actuating magnets; and the conveying device is configured to convey the at least one transport body relative to the stator by controlled positioning and/or orientation of the several actuating magnets by means of the actuating element.

In this context, in particular to provide a floating transport, a conveying device is proposed with a stator for controlled conveying of a transport body relative to the stator. Here, advantageously, a controlled conveying of a transport body relative to a stator is possible in that one of the two elements has a plurality of actuating magnets which are arranged so as to be at least partially movable and the respective positions and/or orientations of which relative to this element may be predefined by actuating elements in controlled fashion, and the other of the two elements has at least two stationary magnets connected immovably to this element, wherein the stationary magnets are magnetically coupled to actuating magnets. The conveying device is configured to convey the transport body relative to the stator by controlled positioning and/or orientation of actuating magnets. The conveying in particular comprises bringing the at least one transport body into a desired position and/or orientation relative to the stator.

This in particular allows a complete magnetic levitation of the transport body in six degrees of freedom, i.e. in three translational and three rotational degrees of freedom relative to the stator. This has the advantage that the transport body can be conveyed more flexibly than in conventional systems.

Furthermore, this offers the advantage that levitation and/or translational movement of the transport body relative to the stator can be achieved by corresponding positioning and/or orientation of the actuating magnets by means of the respecting actuating elements. In this way, there is no need to provide a complex arrangement and actuation of magnetic coils. This not only reduces the complexity of the conveying device and hence the production costs, but also allows the use of permanent magnets which can often provide a much greater flux density than magnetic coils which may be used for such purposes. This in turn may allow a greater lift height or greater air gap between the stator and the transport body, whereby a greater freedom of movement is possible in movements in the Z direction and/or in the angular range for pitch and roll. Furthermore, this offers the advantage that even an interruption in the supply of electrical energy need not necessarily lead to a malfunction or cause damage. In particular, an interruption in the power supply need not lead to a loss of the magnetic field or magnetic coupling between stator and transport body. For example, in the case of an interruption in the power supply, the coupling forces between the actuating magnets and the stationary magnets may increase as soon as the position and/or orientation of the actuating magnets respond to the attraction force effect of the stationary magnets, whereupon the transport body is drawn towards the stator and thus secured against uncontrolled falling. In addition, this advantageous embodiment offers the advantage that the magnetic coupling between the stator and the transport body can achieve both a levitation of the transport body, i.e. a lift above the stator, and a translational movement of the transport body relative to the stator, i.e. conveying, without further contacting or contactless systems being absolutely essential. In this way, contactless transport becomes possible so that the conveying device may also be used in environments with increased cleanliness requirements (such as the above-mentioned clean rooms in semiconductor production). For example, the transport body may be conveyed in an environment with increased cleanliness requirements while the stator is arranged outside in an environment with lower cleanliness requirements. For example, the separating elements may run through an air gap between the stator and the transport body in order to separate the different cleanliness regions. Thus the conveying device is also suitable for use in chemical processes, such as in the chemical zone of semiconductor production, and for example in gas-tight, fluid-tight and/or encapsulated zones.

Furthermore, the advantage may be achieved that it is not necessary to provide magnetic coils in either the transport body or the stator, so that heating of the transport body and/or the stator by the currents occurring in such coils can be avoided. This promotes use of the conveying device in heat-critical environments or for conveying heat-sensitive objects, and improves the energy efficiency of the conveying device since the dissipation of electrical energy can be reduced.

Owing to the advantageous levitation or conveying by means of magnetic coupling, the transport body or conveying device can be efficiently decoupled from oscillations and/or vibrations and/or body-borne sound waves, whereby the conveying device may also be used for conveying sensitive objects, such as semiconductor products, in a particularly advantageous fashion.

Preferably, the conveying device comprises a plurality of actuating magnets and/or a plurality of stationary magnets. Particularly preferably, the actuating magnets and/or the stationary magnets are arranged over a conveying surface in or on the stator, or in or on the transport body, so that the transport body can be levitated and/or conveyed along the conveying surface. In this way, a larger region is created in which the transport body can be conveyed. Particularly preferably, the actuating magnets as a whole have a number of degrees of freedom which is at least as large as the number of degrees of freedom of the transport body, in which the transport body is to be conveyed or positioned in controlled fashion. If for example the transport body is to be conveyed and/or positioned in six degrees of freedom, it is advantageous to provide several actuating magnets which in total have six or more degrees of freedom. For example, for this the actuating magnets may be configured so that the transport body interacts with at least six actuating magnets at each time.

Preferably, the magnetic field of the actuating magnets and/or the magnetic field of the at least two stationary magnets faces the conveying surface, i.e. one magnetic pole faces the conveying surface. The conveying surface is the surface along which the transport body is conveyed relative to the stator in controlled fashion. In particular, the conveying surface may coincide with a stator plane and/or an action surface of the stator. Particularly preferably, the conveying surface lies in a (transport) plane. In addition, the conveying surface may also be curved and/or may run with at least one bend or in inconstant fashion. For example, a surface lying between the stator and a transport body levitated from the stator may constitute the conveying surface. Such an arrangement offers the advantage that the magnetic coupling between the actuating magnets and the stationary magnets can be increased or optimised. Preferably, the magnetic poles of the actuating magnets and stationary magnets are arranged facing each other, or such that their magnetic fields have an overlap and/or interact. Preferably, the magnetic fields are minimised in directions facing away from the conveying surface.

According to an advantageous embodiment, it is proposed that the conveying device is configured to convey at least two transport bodies (relative to the stator in controlled fashion) along different conveying paths on the conveying surface, in particular such that one transport body can overtake another transport body. In this context, waiting zones may also be formed, in particular such that one waiting transport body can pass another. In addition, it may be provided that an overtaking transport body observes a (predefined) minimum distance from the other transport body. The minimum distance in this context is predefined in particular such that the overtaking transport body does not disrupt the magnetic floating of the other transport body.

According to a further advantageous embodiment, it is proposed that the conveying device is configured to convey at least two transport bodies (relative to the stator in controlled fashion) along a conveying path having at least two tracks on the conveying surface. In this way, advantageously, multitrack transport paths are possible on the conveying surface, whereby the production capacity can advantageously be increased.

According to a further advantageous embodiment, it is proposed that the conveying device is configured to convey the at least one transport body (relative to the stator in controlled fashion) up to a (wafer) processing station, and/or to position or align (orient) the wafer transported by means of the transport body in a processing station. The processing station may for example be a chemical processing station, a lithographic processing station or an inspection station in which the wafer may for example be inspected by means of a microscope.

Alternatively or cumulatively, the conveying device may be configured to convey the at least one transport body (relative to the stator in controlled fashion) up to a store or storage unit for wafers, and/or to position and/or align (orient) the wafer transported by means of the transport body in a store or storage unit for wafers. Preferably, the conveying device is configured to convey the at least one transport body from and/or out of a store or storage unit for wafers up to and/or into a processing station.

Furthermore preferably, the conveying device is configured to convey the at least one transport body (relative to the stator in controlled fashion) through a (wafer) processing station. Furthermore, the conveying device may be configured to convey the at least one transport body (relative to the stator in controlled fashion) along a (wafer) processing station such that the wafer transported by means of the transport body is conveyed through the (wafer) processing station. In addition, the conveying device may be configured to position and/or align (orient) the wafer transported by means of the transport body in the processing station during transport through the processing station.

In the processing station for example, an environment with increased cleanliness requirements (clean room) and/or a vacuum may be provided. In this context, it is particularly preferred if, for moving the wafer into the processing station, only part of the transport body, for example a holder or gripper or pincers of the transport body, protrudes into the processing station. This part of the transport body may for example pass through a lock arranged in front of the processing station.

Orientation of the wafer (the position of the wafer) in the processing station may be achieved for example by tilting the transport body relative to the conveying surface and/or by rotating the transport body about its vertical axis. A positioning of the wafer (the position of the wafer) in the processing station may be achieved for example by a (two-dimensional) movement along the conveying surface and/or a rotation of the transport body about its vertical axis. A tilt of the transport body relative to the conveying surface may additionally be advantageous also during conveying along the conveying surface, since this may in some cases achieve an increased conveying speed. For example, a (targeted) tilting of the transport body may prevent the wafer from falling down during acceleration of the transport body.

Preferably, the at least two stationary magnets and/or the actuating magnets each comprise at least one permanent magnet. This has the advantage that the use of magnetic coils in the stator and/or in the transport body may be reduced or even completely avoided, and hence the energy consumption of the conveying device can be reduced. Furthermore, by means of permanent magnets, in comparison with magnetic coils, a very strong magnetic field can be generated which may also be provided in a small space. Also, when permanent magnets are used to provide the magnetic field, there is no need to provide electrical power to the magnets, as is the case for example when magnetic coils are used. Also, permanent magnets do not dissipate electrical power and hence do not contribute to an undesirable heating of the conveying device. Particularly preferably, a stationary magnet and/or an actuating magnet comprises exclusively one or more permanent magnets, without any additional magnetic coils. This may for example avoid the need to contact the transport body with an electrical energy supply line which constitutes an obstruction to translational movement.

Preferably, a permanent magnet (at a point on the surface) provides a magnetic flux density of at least 0.05 T, preferably at least 0.1 T, further preferably at least 0.25 T, even further preferably at least 0.5 T, particularly preferably at least 0.75 T, and most preferably at least 1 T. In particular, permanent magnets may be selected such that the forces and moments necessary for transport and/or positioning of the transport body may be achieved by the selected flux densities. Permanent magnets with a greater flux density may for example serve to create a greater lift and/or greater accelerations, and/or to convey heavier loads by the transport body.

Preferably, an actuating magnet comprises a magnet group which preferably has several permanent magnets and/or magnetic coils. Preferably, the stationary magnets also form at least one magnet group, wherein the magnet group preferably comprises several permanent magnets and/or magnetic coils. In particular for the case where the several magnets of a magnet group are arranged in a straight line, it may be advantageous to arrange the magnets such that the several magnets are oriented or arranged such that their magnetic dipoles are not oriented in parallel or do not point in the same direction, in particular are not all oriented parallel to the straight line. A non-parallel arrangement of the dipoles may be advantageous for controlled conveying or movement of the transport body in all six degrees of freedom.

Particularly preferably, the plurality of permanent magnets and/or magnetic coils of the at least one magnet group is arranged at least partially according to a Halbach array. This offers the advantage that the magnetic fields generated by the several magnets amplify each other in one direction leading away from the Halbach array, and reduce or even completely extinguish each other in another direction leading away from the Halbach array. This may be advantageous for example in that the magnetic fields can be amplified in a direction between the stator and the transport body, while the magnetic fields reduce or even extinguish each other in other directions. Thus the magnetic field may be utilised particularly efficiently for levitation, and/or the magnets in a Halbach array may be arranged adjacent to each other, in particular in a small space, without negatively influencing each other. Preferably, the Halbach arrays are arranged such that a magnetic field of the magnet group extends preferably up to the conveying surface or action surface. In particular, the arrangement as a Halbach array allows a reduction in the total weight and/or inertia moment of the magnets for the same coupling forces and moments. Superficial arrangements of magnets which form Halbach arrays in different spatial directions are most preferred for transmitting high forces and moments in all degrees of freedom.

Preferably, the actuating element comprises a drive element which is configured to change the position and/or orientation of the connected actuating magnet in a controlled fashion. For example, such a drive element may comprise an electric motor which is connected to the actuating magnet directly or via a gear mechanism and/or a linkage in order to move the actuating magnet. Also, a drive element may be configured such that several actuating magnets can be moved thereby. Such arrangements have the advantage that the position and/or orientation of the actuating magnets connected to an actuating element may be changed individually. For example, the actuating element may be configured such that it can rotate the actuating magnet or magnets about an axis and/or a centroid of the actuating magnet. Furthermore, a drive element may be configured such that more than one degree of freedom of the at least one actuating magnet can be moved thereby. Further preferably, the actuating magnet comprises a sensor element which is configured to determine the position and/or orientation of the actuating magnet connected to the actuating element. This allows the orientation and/or position of the actuating magnet to be controlled and the desired effect to be achieved by means of the actuating magnet in an efficient and effective fashion. Further preferably, the actuating magnet comprises a control element which is configured to set the position and/or orientation of the actuating magnet connected to the actuating element to a predefined value by means of the drive. For example, the control element may comprise a control and/or regulating unit, by means of which the movement of the actuating magnet can be controlled and/or regulated via the drive element. In this way, the actuating magnet can be positioned and/or oriented particularly quickly and precisely.

In addition, a conveying device may also comprise a position determination unit which is configured to determine a relative position and/or orientation of the at least one transport body relative to the stator. For example, the position determination unit may comprise optical sensors and/or capacitive sensors and/or magnetic field sensors such as Hall sensors, which at least partially determine a position and/or orientation of the transport body relative to the stator on the basis of the magnetic field created by the transport body.

According to a further aspect, a method is proposed for operating a conveying device proposed here, wherein the at least one transport body is moved freely on the conveying surface into a desired position and/or orientation.

The details, features and advantageous embodiments explained in connection with the conveying device may apply correspondingly to the method proposed here, and vice versa. To this extent, reference is made in full to the statements made above for characterising the features in detail.

Further advantages and embodiments of the disclosure arise from the description and the attached drawing.

It is understood that the features outlined above and to be explained below may be used not only in the combination given but also in other combinations or alone without deviating from the present disclosure.

The disclosure is depicted diagrammatically in the drawings by means of exemplary embodiments and is described in detail below with reference to the drawings, without however being restricted to the exemplary embodiments shown.

The same or similar elements carry the same reference signs. Corresponding explanations are not repeated for the sake of conciseness.

BRIEF DESCRIPTION OF THE DRAWINGS

FIGS. 4A to 4M show, in schematic depictions, top views of various arrangements of stationary magnets or magnet groups.

DETAILED DESCRIPTION OF THE DRAWINGS

Figure 1:
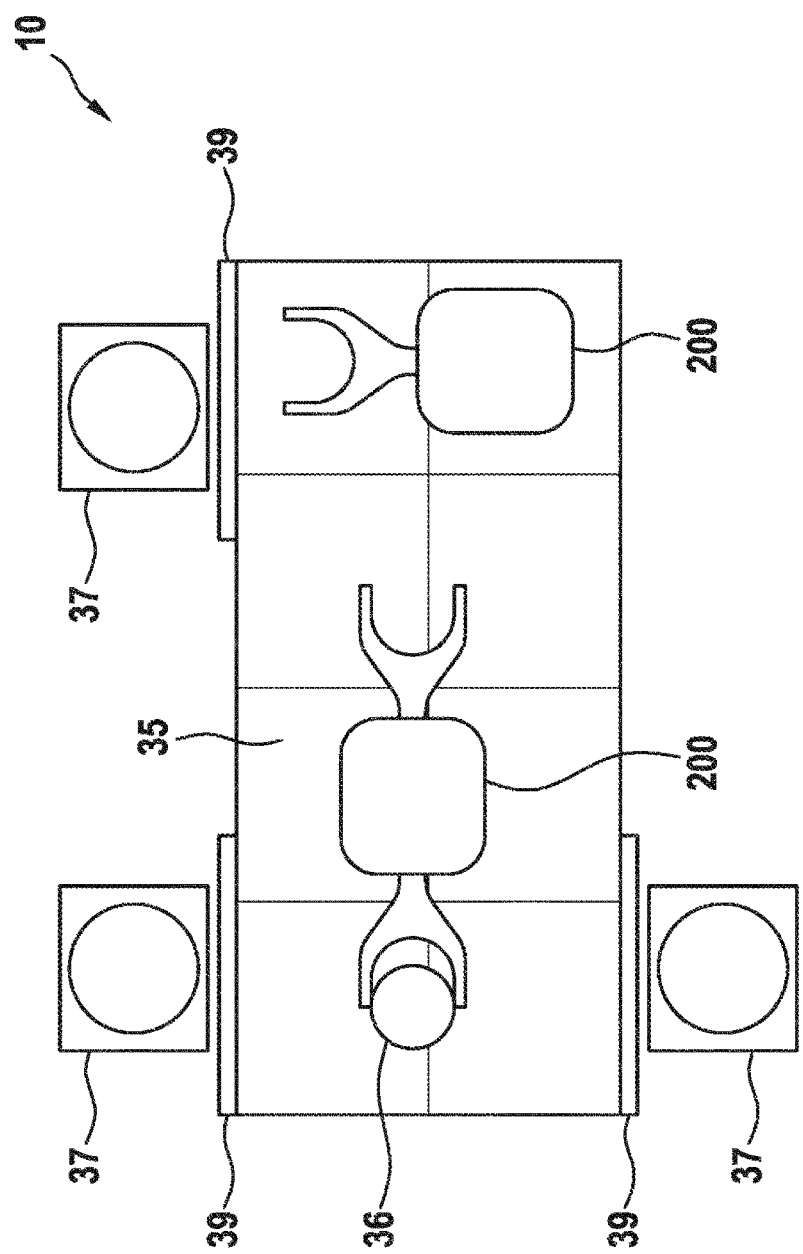
FIG. 1 shows diagrammatically a top view of a conveying device according to a preferred embodiment.

FIG. 1 shows diagrammatically a top view of a conveying device 10 according to a preferred embodiment. The conveying device 10 serves for conveying at least one wafer 36. The conveying device 10 has here for example two transport bodies 200. Each transport body 200 is configured to carry and/or hold at least one wafer 36, here for example by parts of the transport body 200 being formed in the manner of grippers. Furthermore, the conveying device 10 is configured to move the transport bodies 200 two-dimensionally on a conveying surface 35.

The transport bodies 200 may move substantially freely on the conveying surface 35 and thus deliver wafers 36 to processing station 37, and in some cases hold them in the processing stations 37 or position and/or align them therein. In order nonetheless to be able to guarantee an optimal separation of the interior of the processing stations 37 from the environment, slit valves 39 for example may be provided, through which at least the part of the transport body 200 holding the wafer or wafers 36 may protrude (when the valve is open).

Figure 2A:
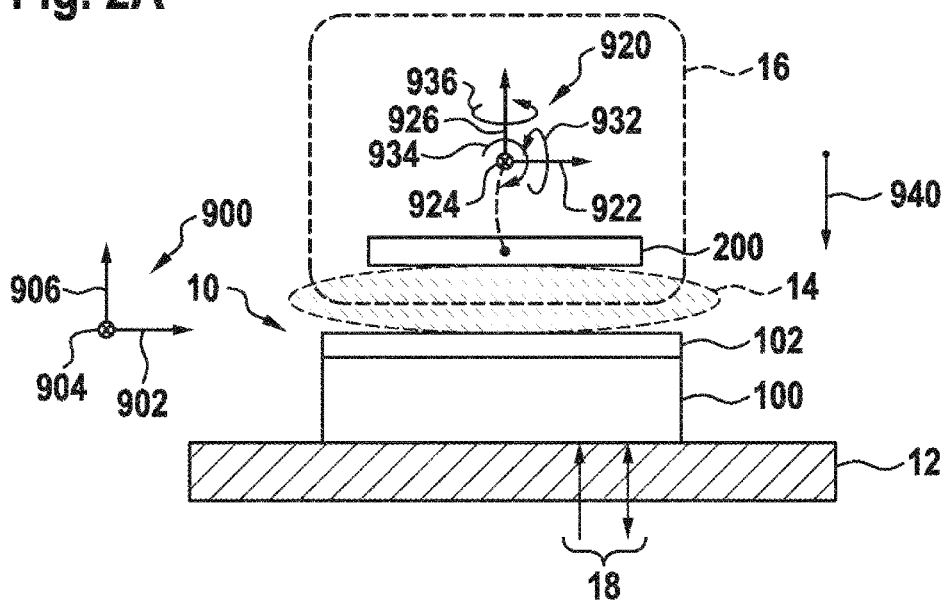
FIGS. 2A to 2E show schematic depictions of conveying devices according to preferred embodiments.

FIG. 2A shows, in a schematic depiction, a conveying device 10 according to a preferred embodiment with associated coordinate systems 900 and 920. The conveying device 10 shown is arranged on a machine table 12 and comprises a stator 100 and a transport body 200. A levitation field 14, which in this case is an actively regulated magnetic field, is depicted diagrammatically between the stator 100 and the transport body 200. The levitation field 14 is produced on the action surface 102 of the stator 100 by actuating magnets and stationary magnets (not shown) which are formed in the stator 100 and transport body 200 respectively. The levitation field 14 is situated between the stator 100 and the transport body 200, wherein the transport body 200 floats in the levitation field 14. The dotted line diagrammatically depicts an optional hermetic seal 16, which allows the transport body 200 to be conveyed inside the hermetic seal 16 by means of the stator 100 positioned outside the hermetic seal 16. Furthermore, the figure depicts schematically connections 18, by means of which the conveying device 10 may be supplied with electrical energy and via which communications data may be received and/or transmitted.

The position and orientation of the transport body relative to the stator may be described in a stator coordinate system 900 which is spanned by an X direction 902, a Y direction 904 and a Z direction 906. The transport body has its own transport body coordinate system 920 which is spanned by an X1 direction 922, a Y1 direction 926 and Z1 direction 926, and comprises a roll angle 932, a pitch angle 934 and a yaw angle 936.

The conveying device 10 is preferably controlled such that the transport body 200 is levitated in stable fashion and guided on a predefined nominal curve with respect to translation and rotation.

Figure 2B:
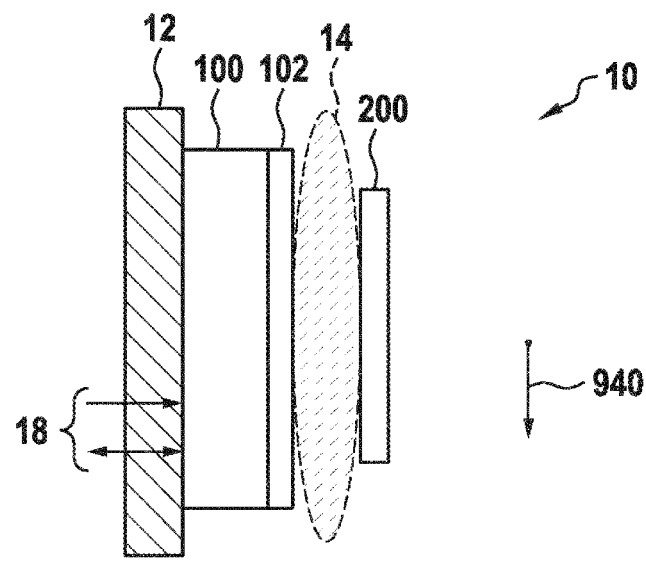
Figure 2C:
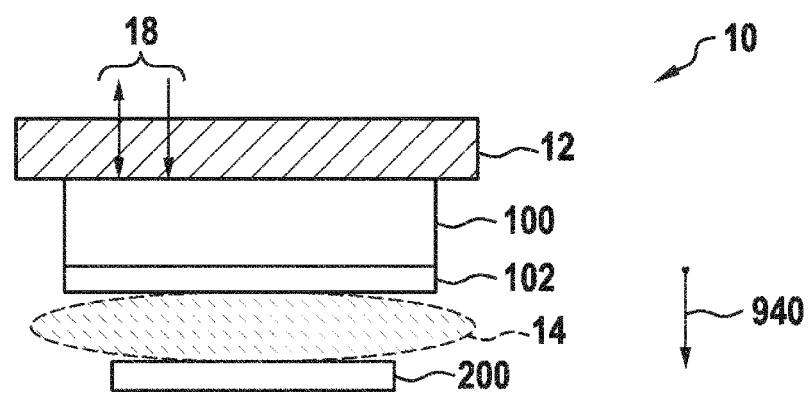

Whereas FIG. 2A shows a conveying device 10 in table mode, i.e. arranged or lying in a plane so that the transport body 200 is accelerated in the direction of stator 100 by the gravitational force 940, FIG. 2B shows a conveying device 10 in wall mode in which gravity accelerates the transport body substantially parallel to the conveying surface. The magnetic coupling between the stator 100 and the transport body 200 is set such that the forces to compensate for gravity also act parallel to the conveying surface. The levitation field 14 here prevents the transport body 200 from slipping and/or stumbling. Insofar as actuating magnets and stationary magnets (not shown) comprise permanent magnets, slipping and/or stumbling may still be prevented even when the electrical power supply is interrupted. The same applies to a conveying device 10 in ceiling mode, as shown diagrammatically in FIG. 2C.

Figure 2D:
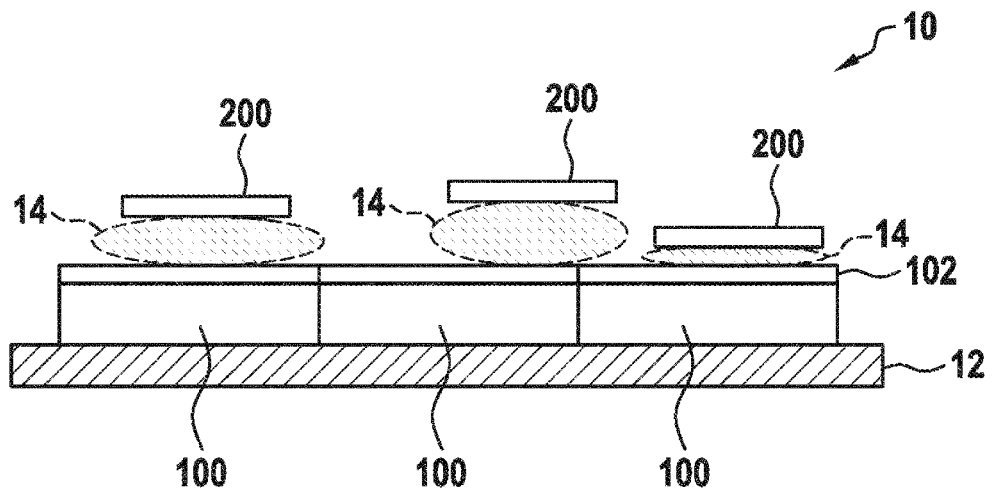

FIG. 2D shows, in a schematic depiction, a conveying device 10 with three transport bodies 200 which are transported via three stators 100 or stator modules arranged adjacent to each other, wherein the stator modules form a flat action surface 102. FIG. 2D also shows a positioning of the transport bodies 200 at different lift heights or at different distances in the Z direction 906.

Figure 2E:
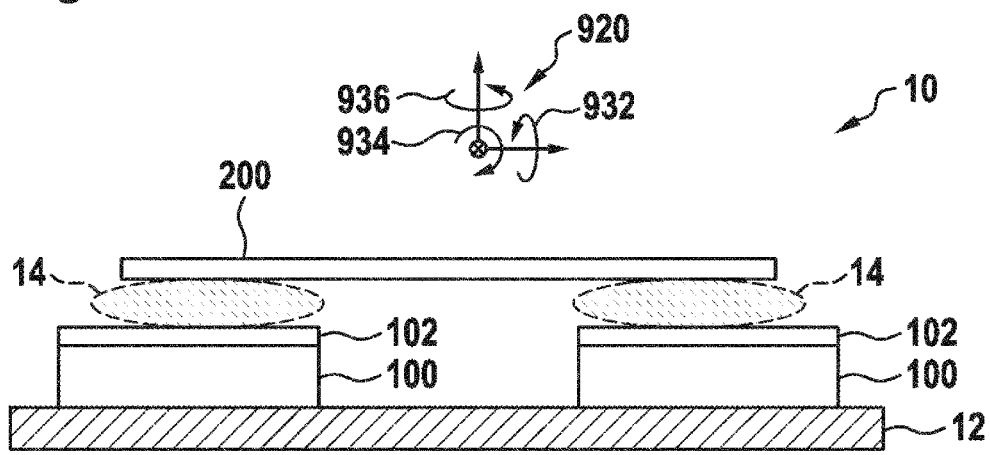

FIG. 2E shows, in a schematic depiction, a conveying device 10 according to a further preferred embodiment, in which a transport body 200 is conveyed or positioned or oriented by two separate stators 100, wherein each stator is coupled only to a partial region of the magnet arrangement in the transport body. In this way, the transport body 200 may be turned about the yaw angle 936 and/or tilted about the roll angle 932 and/or tipped about the pitch angle 934.

Figure 3A:
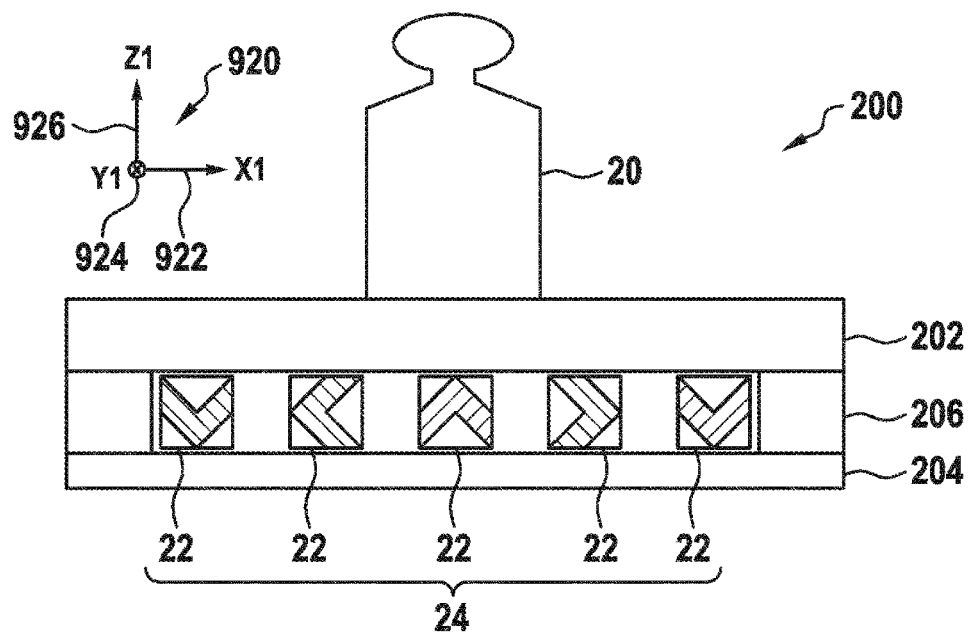
FIGS. 3A and 3B show a transport body according to a preferred embodiment.
Figure 3B:
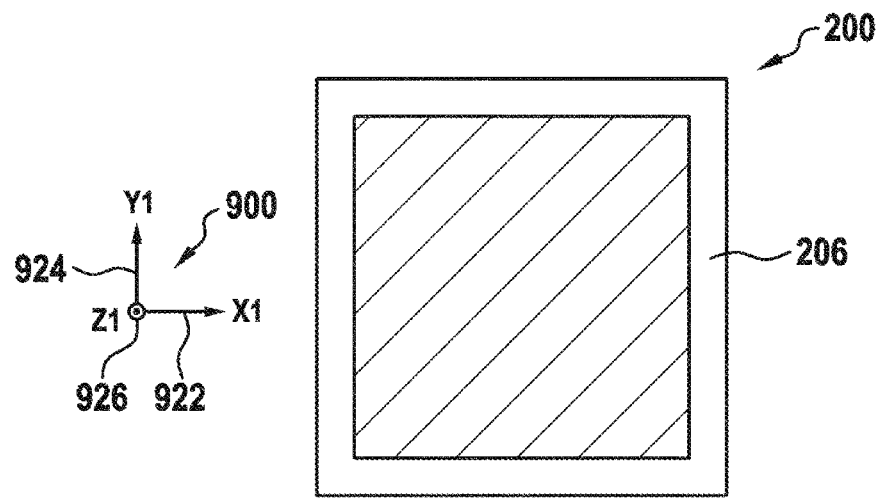

FIG. 3A shows, in a diagrammatic depiction in a cross-section in the X1/Z1 plane, a transport body 200 according to a preferred embodiment, in which the transport body 200 comprises a magnet group 24 of stationary magnets 22. FIG. 3B shows the transport body from FIG. 3A in top view. The transport body 200 furthermore comprises a top cover element 202 and a bottom cover element 204 which are arranged adjacent to the top and bottom of the magnet group 24. In the embodiment shown, different positions along the Z1 direction 926 are designated top and bottom. At the sides of the transport body 200 in the X1 direction 922 and Y1 direction 924, an edge element 206 is formed adjacent to the magnet group 24.

The transport body 200 may serve as a mechanical link between a transport product 20, e.g. a holder for holding a wafer 36, on one side and the stator 100 on the other. Preferably, the transport body 200 is formed as a mechanically rigid element and configured to support or transport a transport product 200 on a top side of the top cover element 202. Preferably, the transport product 20 may be fixed to the transport body 200 and then, together with the transport body 200, guided on a nominal curve over the stator 100 and/or held stable at a nominal position. The transport body 200 according to the embodiment shown is electrically passive, i.e. to perform its function, it requires no electrical energy or connections and in particular comprises no actuating magnets.

According to the embodiment shown, the transport body 200 comprises a plurality of stationary magnets 22 in a superficial arrangement in the X1/Y1 plane, arranged as a magnet group 24 in a geometric arrangement, wherein the geometric arrangement of the stationary magnets 22 is fixed relative to the transport body 200, and the stationary magnets 22 do not therefore move relative to the transport body 200. For example, the top cover element 202 and/or the bottom cover element 204 and/or the edge element 206 may be configured to at least partially fix the stationary magnets 22 in their position or geometric arrangement. Alternatively or additionally, the transport body 200 may comprise one or more further components for fixing the stationary magnets 22. Preferably, the stationary magnets 22 comprise a permanent magnet and/or are configured as permanent magnets. Particularly preferably, the stationary magnets 22 comprise permanent magnets of rare earth alloys.

The position of a magnet or stationary magnet 22 preferably means the position of its centroid. A magnetisation direction of the respective stationary magnet is described by a dipole vector, which is depicted symbolically as a corresponding arrow. It is evident from FIG. 3A that, according to the embodiment shown, with regard to its magnetisation direction, each stationary magnet 22 is arranged or oriented differently from the respective adjacent stationary magnet 22. In the case shown, they form a Halbach array, the magnetic field of which is particularly strong in the −Z1 direction and weakened in the opposite direction. Preferably, as stationary magnets 22, magnets are used which are substantially homogenously magnetised, so that the dipole vectors of individual part volumes of the respective stationary magnet 22 point approximately in the same direction as the total dipole vector of the stationary magnet 22. The dipole vector points in the direction of the arrow tip.

The arrangement of the stationary magnets 22 in the transport body 200 is preferably adapted or matched to an arrangement of actuating magnets 26 (see for example FIG. 8) in the stator 100 such that, in a working region of the transport body 200 on the respective stator 100, the forces and moments necessary for transport can be transmitted from the stator 100 to the transport body 200 and/or always all desired degrees of freedom of the transport body 200 can be controlled independently.

FIGS. 4A to 4M show, in diagrammatic depiction and in top view, different arrangements of stationary magnets 22 which form a magnet group 24. In these figures too, the arrows indicate the magnetisation direction of the respective stationary magnet 22, wherein the stationary magnets 22 marked with a dot or an X have a magnetisation direction which runs out of the drawing plane or into the drawing plane in the Z1 direction 926.

FIGS. 4A to 4G show arrangements of stationary magnets 22 in a regular rectangle pattern. Preferably, a transport body 200 comprises at least two stationary magnets 22 (see FIG. 4A) which are arranged in linear fashion in a straight line, wherein the dipole moment of at least one of the stationary magnets is not oriented parallel to this straight line. This is particularly advantageous in order to be able to control the transport body 200 or move it in controlled fashion in all six degrees of freedom. Preferably, each transport body 200 has at least three stationary magnets 22 (see FIGS. 4B to 4G) which are situated in a spatial plane, for example the X1-Y1 plane, and/or which form a complex three-dimensional spatial arrangement.

Arrangements in which the stationary magnets 22 are all arranged in one arrangement plane are particularly suitable for applications in which primarily translational movements must be executed parallel to the arrangement plane, and/or rotations about the Z-axis of the stator 100 or the Z1 axis of the respective transport body 200.

Figure 4A:
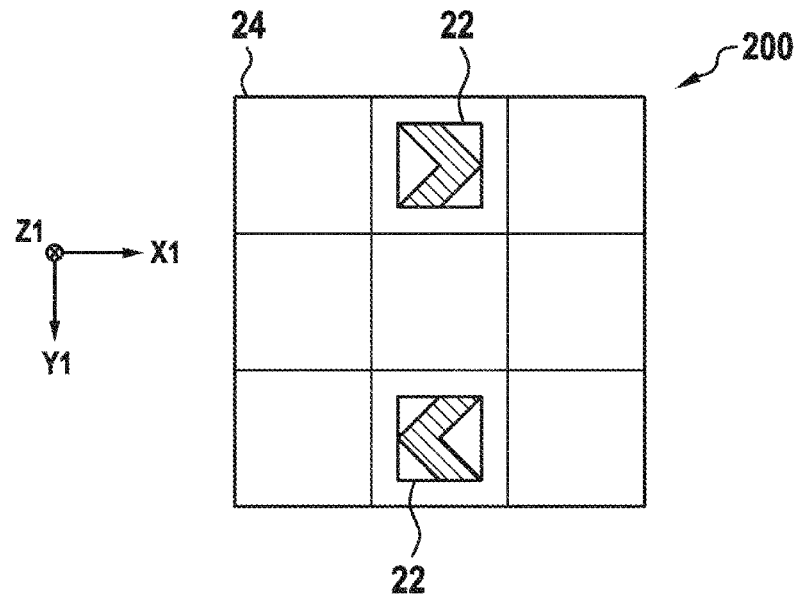
Figure 4B:
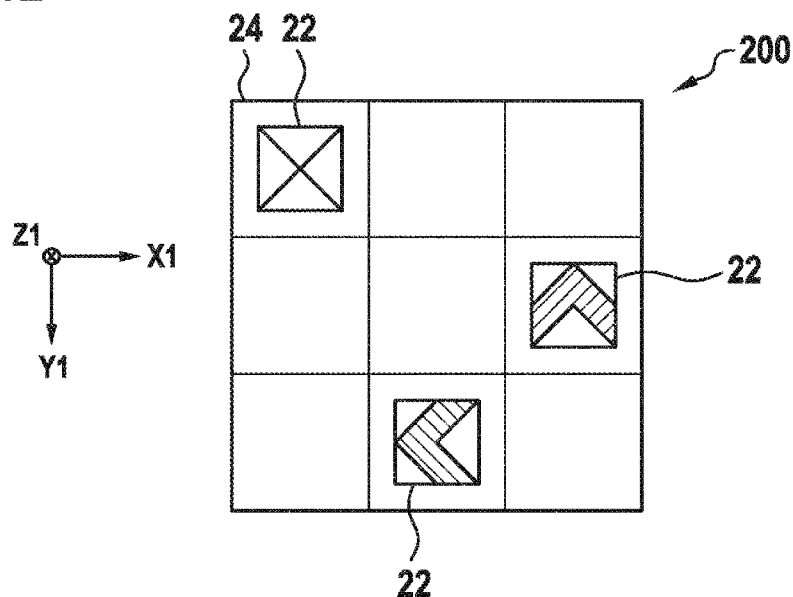
Figure 4C:
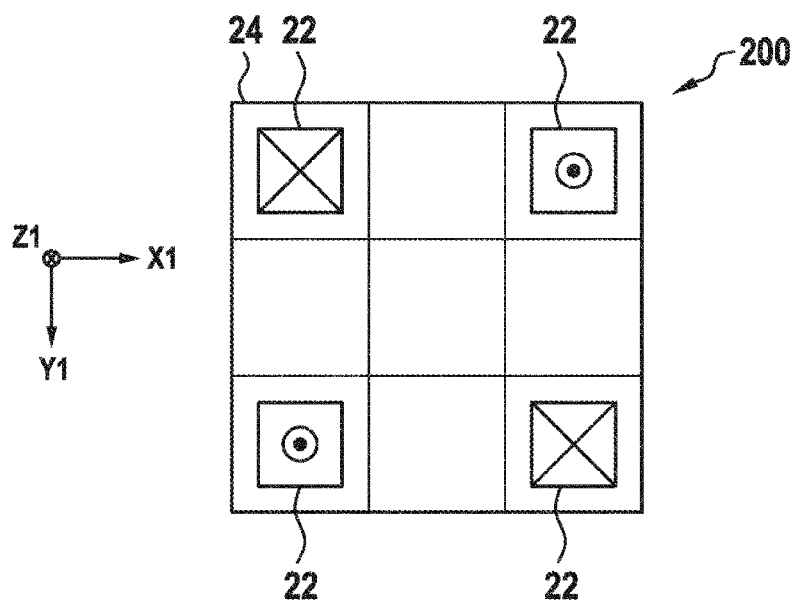
Figure 4D:
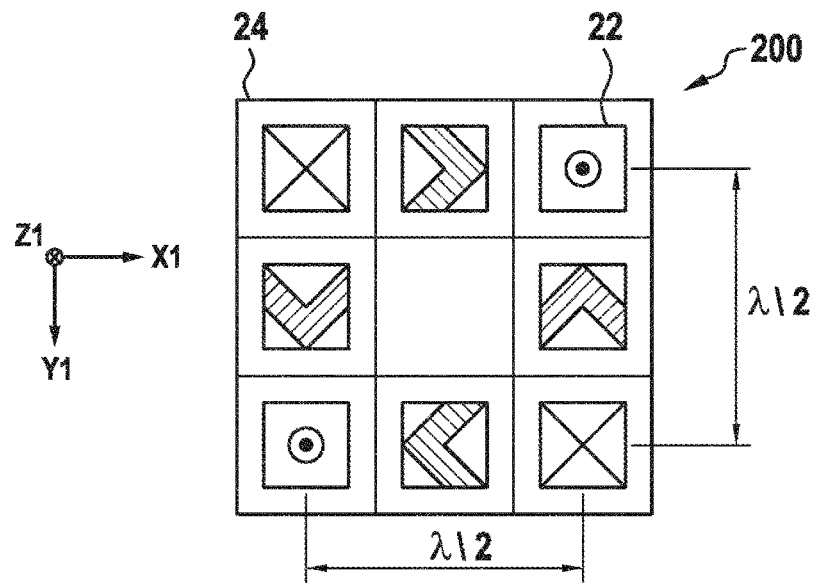
Figure 4E:
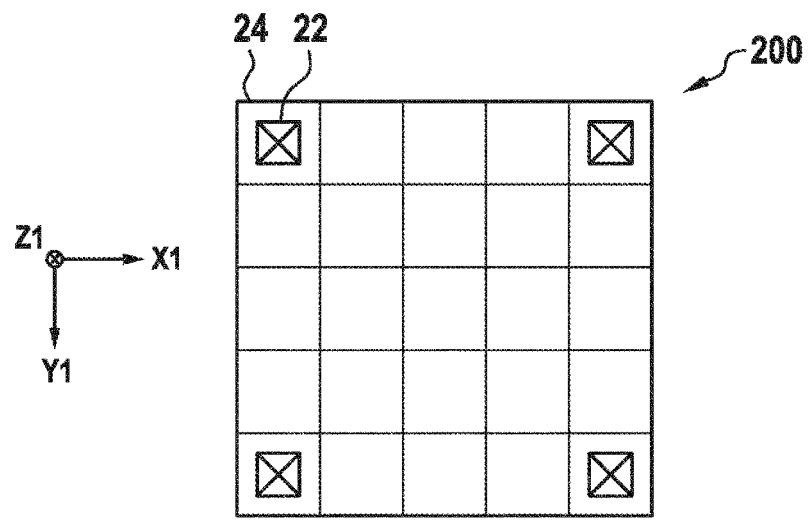
Figure 4F:
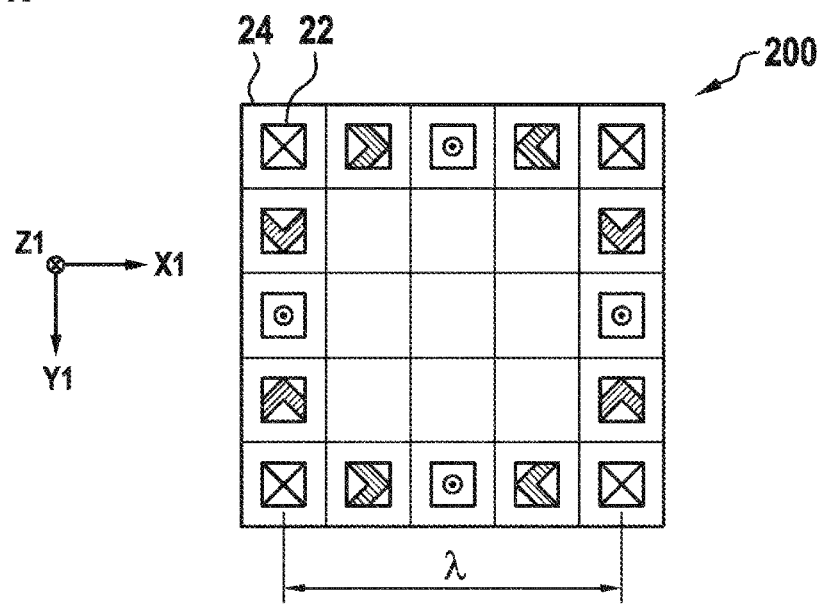
Figure 4G:
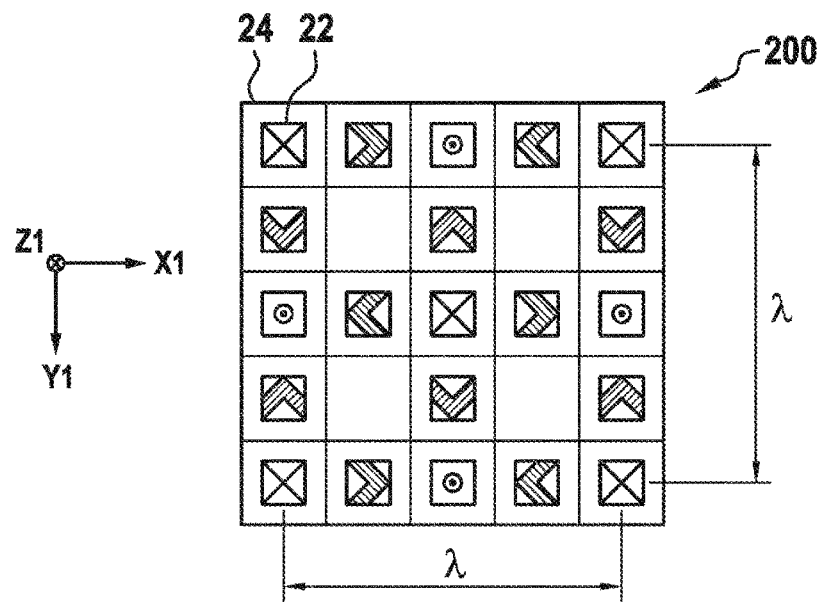
Figure 4H:
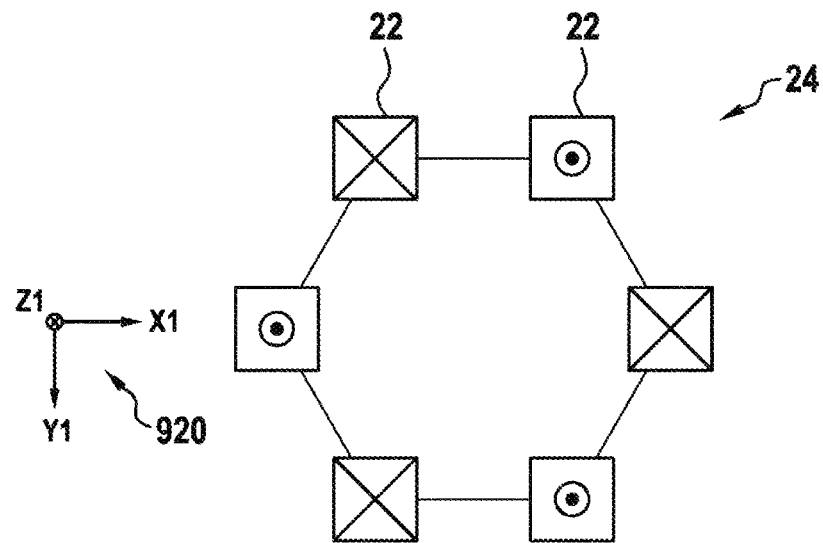

The magnet groups 24 comprise preferably stationary magnets 22 which are arranged as at least one Halbach array. The Halbach array or arrays are preferably oriented or arranged such that the magnetic field or magnetic field intensity is increased in the direction of the stator 100, and/or reduced in the direction of the transport product 20 and/or in the direction of possible adjacent transport bodies 200 which may also be conveyed on the same stator 100. Exemplary arrangements of stationary magnets 22 which form Halbach arrays amongst others are depicted in FIGS. 4D, 4F and 4G. A length λ indicates the length of a Halbach period, i.e. a period of a Halbach array.

Figure 4I:
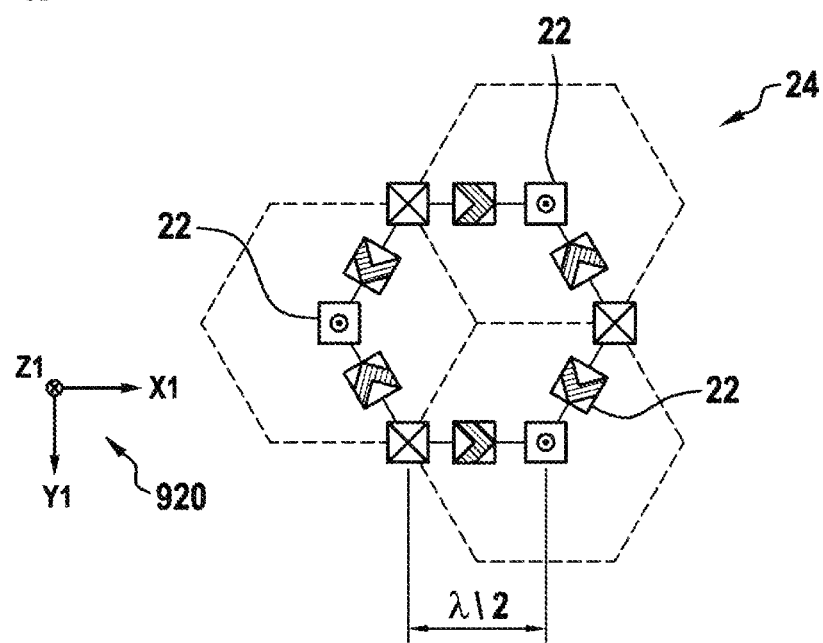
Figure 4K:
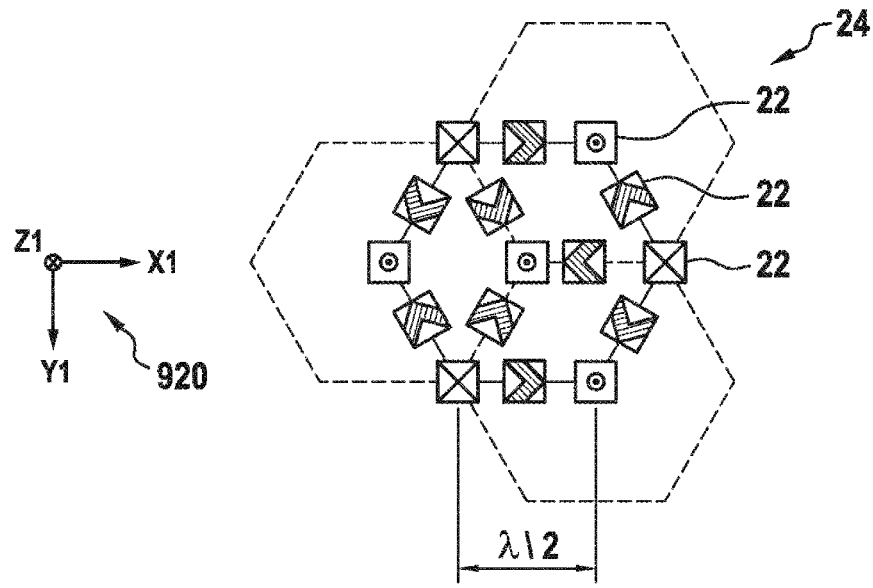
Figure 4L:
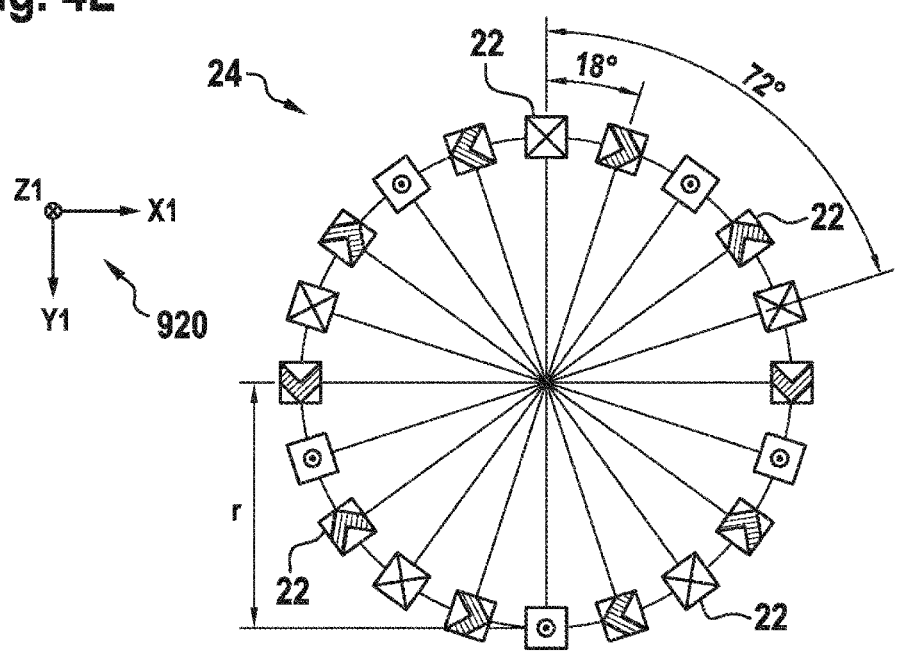
Figure 4M:
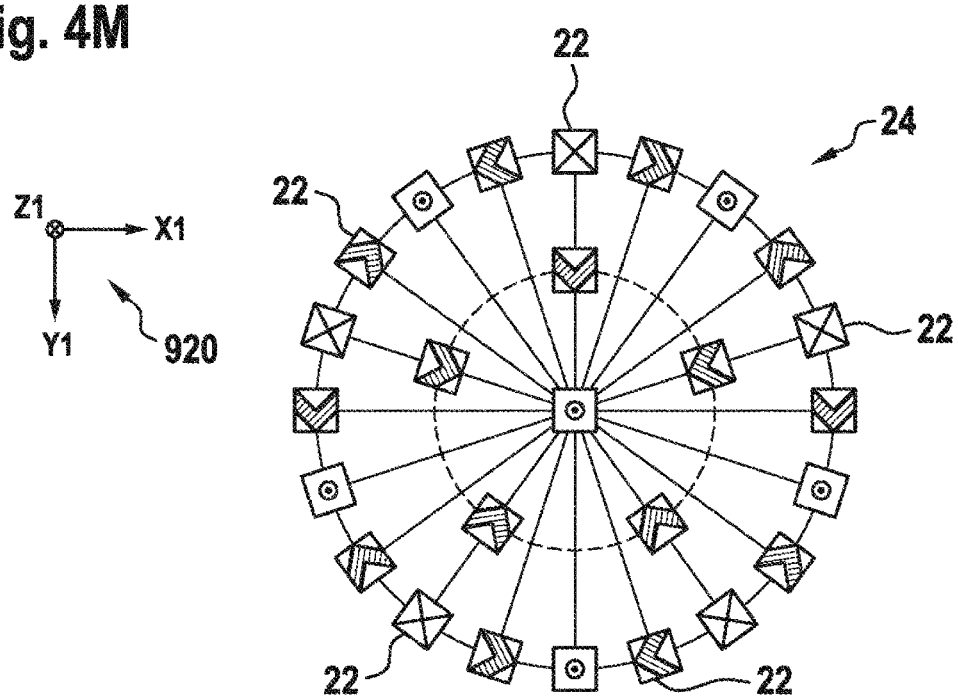

FIGS. 4H to 4K show magnet groups 24 in which the stationary magnets 22 are arranged in a hexagonal pattern. The arrangements according to FIGS. 4I and 4K are based on a two-dimensional arrangement of Halbach arrays. FIGS. 4L and 4M show magnetic groups 24 in which the stationary magnets 22 are arranged in a circular pattern. In particular, FIG. 4L shows an arrangement in which the stationary magnets 22 are arranged in five Halbach arrays or Halbach periods over a respective angular range of 72°. The stationary magnets 22 are arranged equidistantly with an angular spacing of 18°. The arrangement in FIG. 4M has, in addition to the arrangement shown in FIG. 4L, five radially arranged Halbach arrays which share a common stationary magnet 22 in the centre of the circular arrangement. Such arrangements may advantageously be combined with the stator magnet arrangement with square pattern. In particular, such an arrangement may be advantageous in order to avoid singularities with respect to the relative mutual arrangement of actuating magnets and stationary magnets.

Figure 5A:
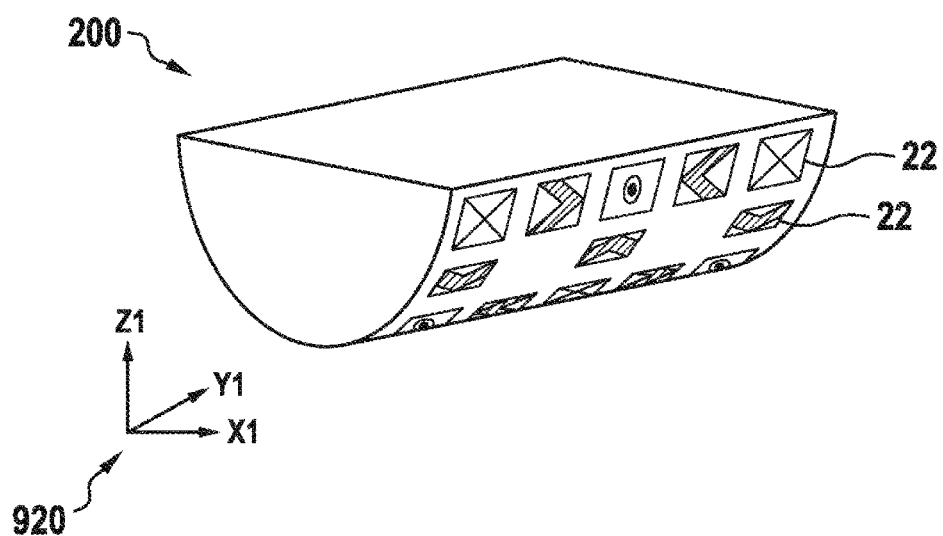
FIGS. 5A to 5C show preferred embodiments of a transport body.
Figure 5B:
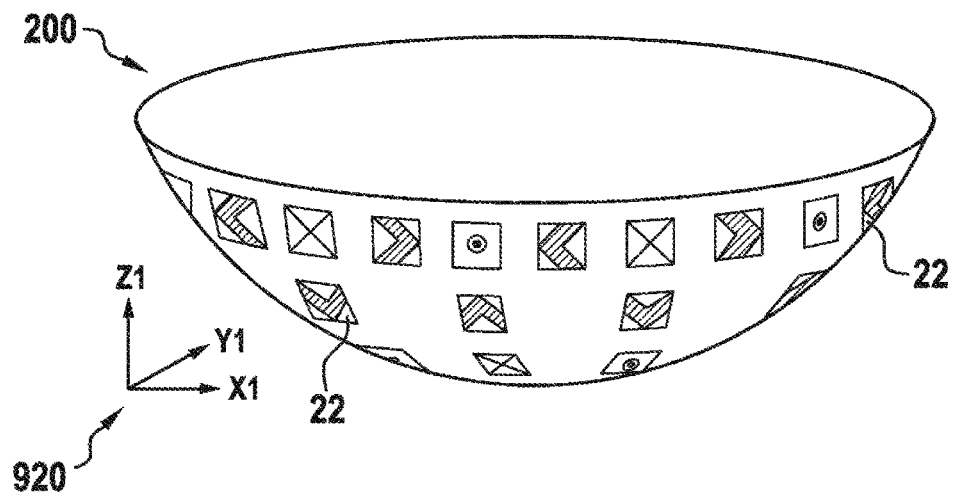
Figure 5C:
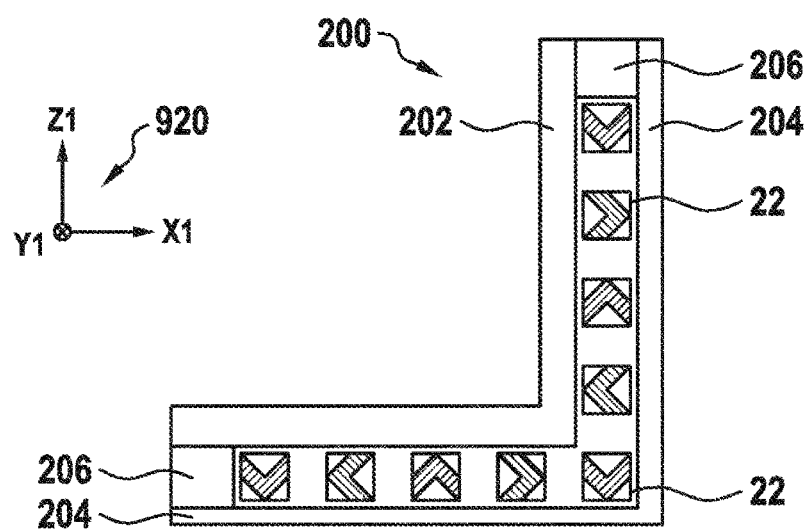

FIGS. 5A to 5C show preferred embodiments of a transport body 200 with a magnet group 24 in which the stationary magnets 22 are arranged in a three-dimensional arrangement. For better depiction, the lower cover layer 204 and the upper cover layer 202 are not shown. FIG. 5A shows a partially cylindrical arrangement of the stationary magnets 22 which can for example provide an enlarged pivot range on rotations about the Y1 axis. FIG. 5B shows an arrangement of the stationary magnets 22 in a ball segment shape, which can provide an enlarged pivot range arranged on rotations about both the X1 axis and the Y1 axis. The two arrangements are not necessarily subject to restrictions with regard to a rotatability or pivotability about the Z1 axis.

The arrangement of the stationary magnets 22 on a curved plane may offer an increased pivot angle range at least in one direction of the transport body 200. For example, a cylindrical transport body 200, the curved casing surface of which as an action surface levitates on a stator 100, may in some cases perform an endless rotation about its cylinder axis. In addition, an endless rotation about the Z-axis of the stator 100 may be possible.

A surface which is curved in two spatial directions may for example enlarge the pivot angle range in two spatial directions of the transport body 200. For example, in some cases a spherical transport body 200 equipped with stationary magnets 22 may execute endless rotations in all spatial directions.

The transport body 200 may also be designed as a segment of a cylinder or ball, as shown for example in FIGS. 5A and 5B, with a curved side equipped with magnets and a flat side configured to receive a transport product. These arrangements may for example offer the possibility of implementing a goniometer table with large pivot angle range (for example 90°) which can additionally execute a rotation about the Z1 axis and preferably a translation in all spatial directions. This arrangement may for example be used advantageously in machining processes such as laser machining, or in test processes and in industrial image processing, since for example a workpiece used as a transport product 20 may be positioned and/or oriented freely within wide areas below a machining tool or test means. In addition, optionally, workpieces can be transported rapidly into and out of a process position so as to minimise an often economically inefficient workpiece change time during which the process cannot be used.

FIG. 5C shows a transport body 200 according to a further preferred embodiment in which the stationary magnets 22 are arranged in an angular arrangement. In particular, the transport body 200 shown comprises stationary magnets 22 which extend horizontally in the X1/Y1 plane along a first leg and in the X1/Z1 plane along a second leg. In this way, a transport body 200 may be provided with two action surfaces, as shown for example with a horizontal and a vertical action surface, in order for example to be levitated or conveyed at different times or simultaneously by differently arranged stators 100, for example by one horizontally arranged and one vertically arranged stator 100. Such an arrangement may for example be used in a transport body 200 which is operated at differently oriented action surfaces in an ongoing change. For example, a transport body 200 may have two action surfaces arranged at a 90° angle. When this is operated on an arrangement of two stators which are also arranged at an angle of 90° to each other, wherein one stator 100 is operated horizontally and the other stator 100 vertically, it is possible for example to change from floor to wall operation without the need for interruption.

A structural component or housing or frame of a transport body 200, which for example holds together the individual components of the transport body 200 such as the stationary magnets 22, is preferably made of non-ferromagnetic material, for example of plastic and/or ceramic and/or non-ferrous metals. Optionally, it has an edge element 206 not equipped with magnets, which serves for example as a spacer from other transport bodies 200, so that preferably mutual contact forces between two touching transport bodies 200 are limited and a free positionability of both transport bodies 200 is not obstructed, preferably also when they are touching.

On the side facing the stator 100, the transport bodies 200 may be provided with a bottom cover element 204, which for example has a cover layer which preferably acts as a spacer from possible objects in the environment of the transport body 200, and preferably can safely limit the distance and hence the maximal action forces of the stationary magnets 22. In this way for example, it is possible to reduce the risk of injury in handling transport bodies 200, such as the risk of crushing fingers on incorrect approach of a ferromagnetic object. Furthermore, preferably an overload limitation may be achieved for drives or actuating magnets in the stator 100, since the forces and moments which the transport body 200 exerts on the actuating magnets in the stator 100 can preferably be limited. In addition, preferably, a better cleaning of the transport body 200 from adhering ferromagnetic particles can be achieved, since the holding forces are lower. Also, an optional integration of additional functions in the bottom cover element may be advantageous, such as for example a coil for inductive energy transmission or a data carrier for identification of the transport body 200.

Several transport bodies 200 may be coupled together mechanically and/or for control purposes in order for example to perform a common function. For example, a passive mechanical parallel kinematic, the bars of which are actively driven and positioned by separate transport bodies 200, may execute handling tasks. In another example, by being moved and conveyed preferably in synchrony, several transport bodies 200 together may transport loads which are too heavy for example for a single transport body 200.

Figure 6:
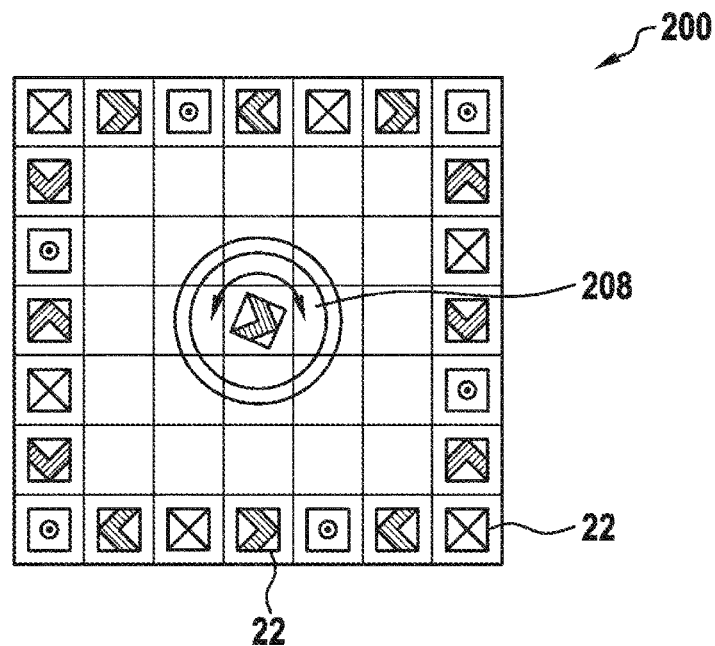
FIG. 6 shows a transport body according to a preferred embodiment with an additional function.

According to a further preferred embodiment, a transport body 200 may also have internal degrees of freedom and for example consist of several components movable relative to each other, so that preferably in total it has more than six degrees of freedom. By providing stationary magnets 22 in several of the components, preferably the more than six degrees of freedom of the transport body 200 can be actively controlled. As FIG. 6 shows, for example a disc 208 mounted rotatably in the transport body 200 may be rotated separately in order for example to execute an additional function on the transport body 200, such as for example a gripping or clamping function for a transport product 20.

In addition, according to a preferred embodiment, a transport body 200 may be equipped with function groups for further additional functions. For example, a mechanical energy transmission may take place in that a disc, preferably mounted rotatably in the transport body 200 and equipped with magnets, is actively driven by the stator 100. For the drive, the disc is treated by the stator 100 for example as a seventh degree of freedom. Also, optionally, an electric contactless energy transmission may be implemented, in that for example coils for inductive energy transmission are integrated in the stator 100 and in the transport body 200. Alternatively or additionally, for example, a permanently rotating magnet in the stator 100 may induce an alternating voltage in a coil in the transport body 200 which can preferably be used to generate power on the transport body 200. On translational movement of the transport body 200, the task of exciting the additional function is continuously transferred to other magnet groups or actuating magnets of the stator 100 which lie for example in an action region of the induction coil. Also for example, a contactless data transmission can be achieved between the stator 100 and the transport body 200, for example with inductive and/or optical transmitters and receivers. Furthermore, optionally a facility for location and/or identification of the transport body 200 may be provided. For example, an optical camera-based sensor in the stator 100 may read a position or identification code provided on the side of the transport body 200 facing the stator 100. For example, at least part of the transport body 200 may be equipped with an identification element such as for example a barcode, using which the conveying device 10 or stator 100 can identify the respective transport body 200.

Figure 7A:
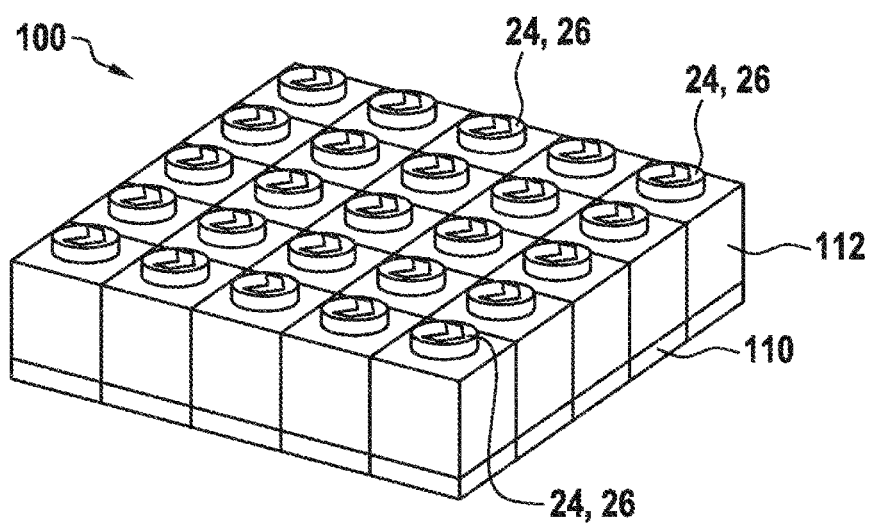
FIGS. 7A to 7D show, in schematic depictions, stators according to preferred embodiments.
Figure 7B:
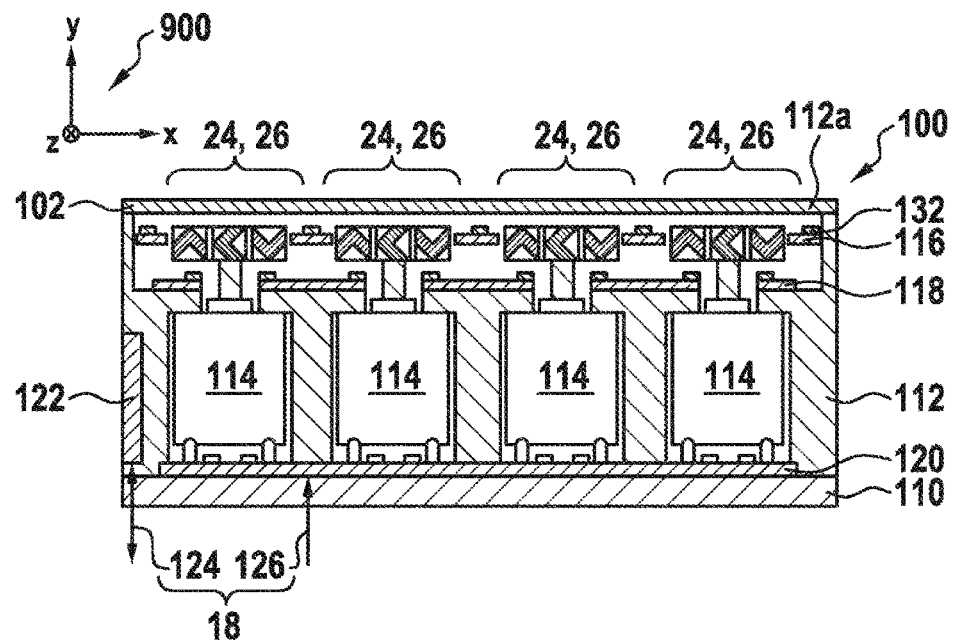

FIGS. 7A and 7B show, in a schematic depiction, a stator 100 according to a preferred embodiment in a perspective view (FIG. 7A) and in a cross-sectional view (FIG. 7B). The stator 100 here has a plurality of actuating magnets 26, each of which again comprises a magnet group 24. The actuating magnets 26 are surrounded at least partially by a structural component 112 of a stator housing. According to the preferred embodiment shown, the magnet groups 24 are arranged on a face or side of the stator 100 which, in the case shown, is the top of the stator 100. Although, in the depiction shown in FIG. 7A, the magnet groups 24 are all oriented similarly, i.e. so that their entire or effective dipole vectors—which result from the individual dipole vectors of the magnets belonging to the magnet group 24—are arranged in parallel, it is pointed out that the magnet groups 24 are configured or arranged movably such that they can rotate relative to the stator housing at least in their arrangement plane. Although the cross-sectional view in FIG. 7B shows only three magnets in each magnet group 24, the magnet groups 24 may comprise fewer or more than three magnets which may be arranged in a one-, two- or three-dimensional arrangement.

The actuating magnets 26 or magnet groups 24 are connected to actuating elements 114, by means of which their position and/or orientation can be changed. An actuating element 114 here has at least one drive, such as an electric motor, which is preferably connected to the magnet group 24 via a drive shaft and/or a gear mechanism and/or a linkage.

The magnetic fields required to guide the at least one transport body 200 are generated by a controlled e.g. regulated movement of the magnet groups 24 or actuating magnets 26 in the stator 100. The magnetic field generated by the magnet groups 24 emerges at least partially from the action surface 102 of the stator 100 and exerts forces and/or moments on the stationary magnets 22 in the transport body 200. The direction and intensity of the forces and/or moments in the transport body 200 are influenced by the position or orientation of the actuating magnets 26 or magnet groups 24 in the stator 100. The position of the actuating magnets 26 or magnet groups 24 in the stator 100 is here, preferably, controlled such that the transport body 200 floats and is guided along a predefined nominal curve in all six dimensions or held in stable fashion at a predefined nominal position with a predefined nominal orientation.

As FIG. 7B shows, the stator 100 comprises an arrangement of movable actuating magnets 26. Actuating elements 114 can change the orientation and/or position of the magnet groups 24 or actuating magnets 26 according to a nominal specification. A transport body position determination element 116 is configured to determine an actual position of all transport bodies 200 conveyed on the stator 100, or all transport bodies in the influence zone of the respective stator 100. For example, the transport body position determination element 116 may comprise a sensor layer and/or a circuit board with sensors. A control element 122 can preferably evaluate the sensor signals provided by the transport body position determination element 116, and provide these for example to a higher-level system. The actuating elements 114 may for example be contacted via a circuit board 120.

Furthermore, according to the preferred embodiment shown, the stator 100 comprises a magnet position determination element 118, by means of which the actual position and/or orientation of the magnet groups 24 or actuating magnets 26 can be determined. For example, the magnet position determination element 118 may have a sensor layer.

The arrangement of the magnet groups 24 in the stator 100 is preferably flat, i.e. preferably all magnet groups 24 are arranged in one plane.

Figure 7C:
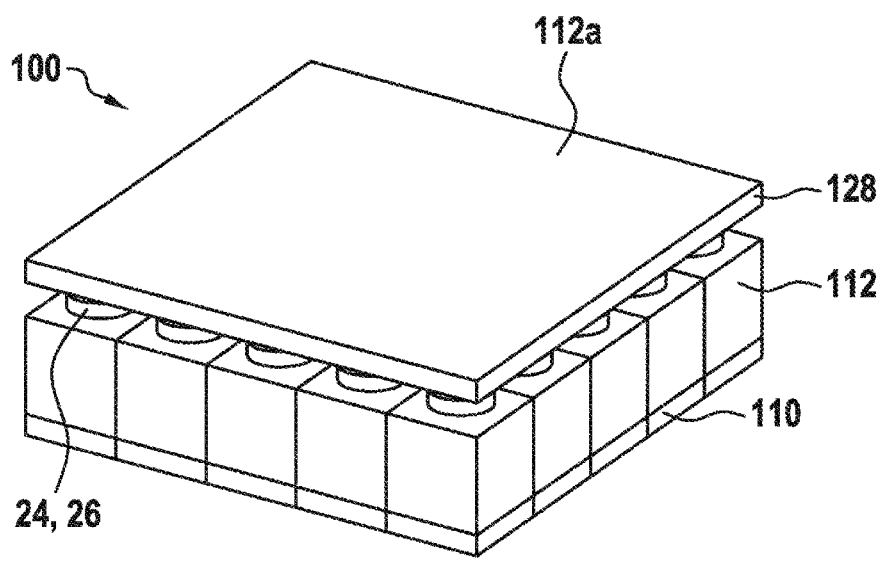
Figure 7D:
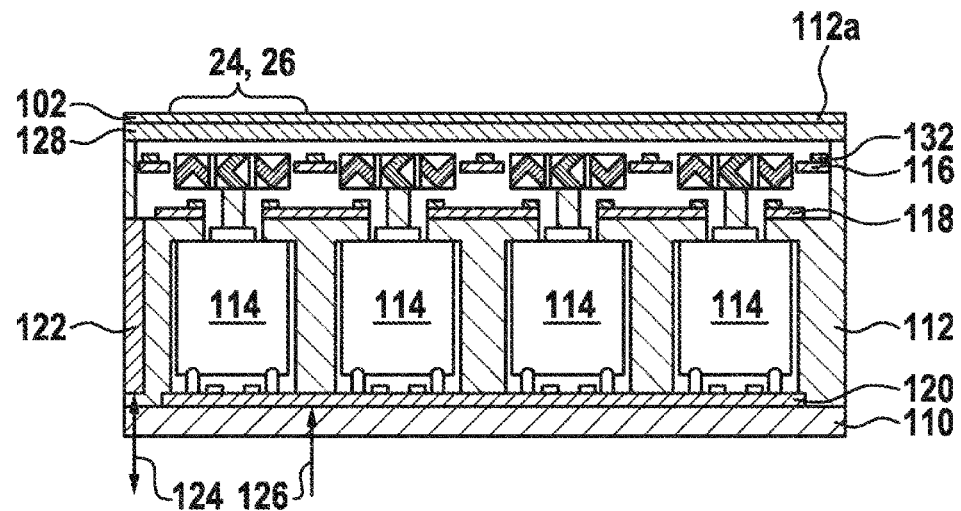

FIGS. 7C and 7D show a stator 100 according to a further preferred embodiment which is similar to the embodiment shown in FIGS. 7A and 7B, and which additionally comprises a cover 112a and an optional coil layer 128. The cover 112a is preferably made of non-ferromagnetic materials. The magnetic field emitted by the magnet groups 24 emerges to the outside through the cover 112a, which for example is made at least partially of plastic and/or non-magnetic metal and/or ceramic and/or glass. The cover 112a may for example screen the interior of the stator 100 from the working space of the transport body 200, and hence prevent the penetration and/or emergence of particles. Furthermore, the cover 112a may serve to securely limit the maximal action forces of the actuating magnets 26 in the stator 100 on objects outside the stator 100. The distance may be designed such that a transport body 200 lying on the cover 112a preferably does not lead to a blockade of the actuating element 114. In addition, preferably an attraction force on ferromagnetic parts which are not correctly deposited on the cover 112a is limited, so that these can easily be detached again and not lead to injuries during handling.

The coil layer 128 may for example be configured as a multilayer circuit board with internal coils.

The surface of the cover 112a facing the at least one transport body 200 preferably forms the action surface 102 of the stator 100. Optionally, a mechanical retraction device may be provided (not shown) which increases the distance of all magnet groups 24 of actuating magnets 26 from the action surface 102. This retraction device may for example be activated automatically on stoppage of the conveying device 10, so that the magnetic fields emerging from the action surface 102 at a standstill are safely limited. Thus for example, safe handling in front of the action surface 102 is possible, and it is easier to remove adhering ferromagnetic particles.

The stator 100 can preferably be operated in any direction relative to gravity, for example in table mode (transport body 200 floating over the action surface 102), in wall mode (transport body 200 floating next to the action surface 102), or in ceiling mode (transport body 200 floating below the action surface 102). Also, in principle, the entire system may be operated in an accelerated reference system or in weightless conditions.

Preferably, the stator 100 is modular in construction so that several identical and/or different stator modules can easily be arranged next to each other, preferably seamlessly (see FIG. 2D). The stator modules are preferably equipped with data connections 124, for example with communications channels, so that information on the state of the stator 100 and the transport bodies 200 thereon can be transmitted, preferably in real time.

The transport bodies 200 may preferably slide freely across from one stator module to another stator module. Thus, preferably, a working range of the transport bodies 200 can be extended as required. Each module furthermore preferably has an interface for energy supply 126 and mechanical interfaces for coupling to further stator modules and for simple integration in a system.

The magnetic field of the stator 100 is preferably produced by a primarily superficial or flat arrangement of the magnet groups 24. The arrangement of the magnet groups 24 preferably forms a regular square pattern of magnet groups 24, but other regular or irregular arrangements are however possible.

Figure 8A:
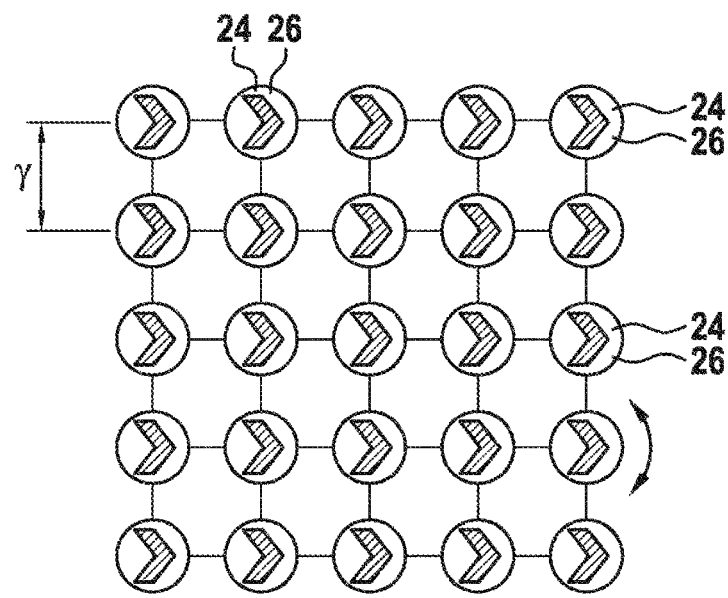
FIGS. 8A to 8E show exemplary arrangements of magnet groups or actuating magnets.
Figure 8B:
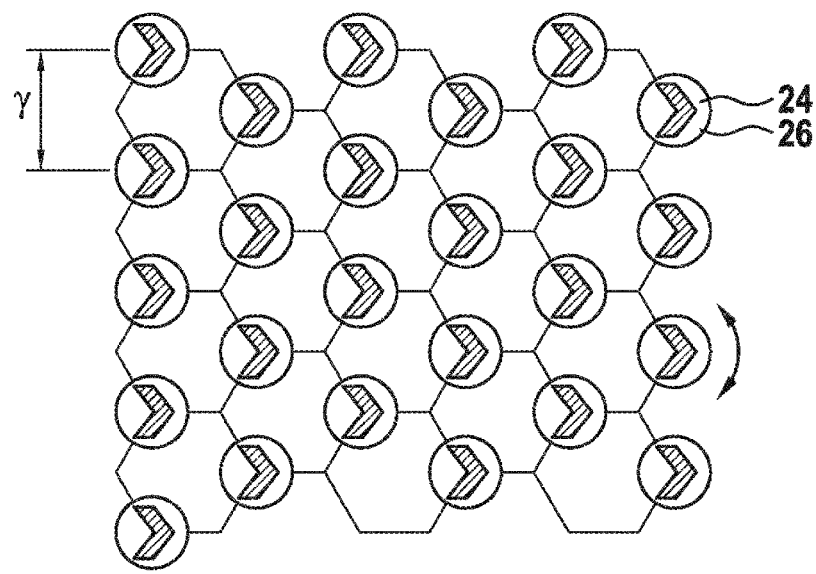
Figure 8C:
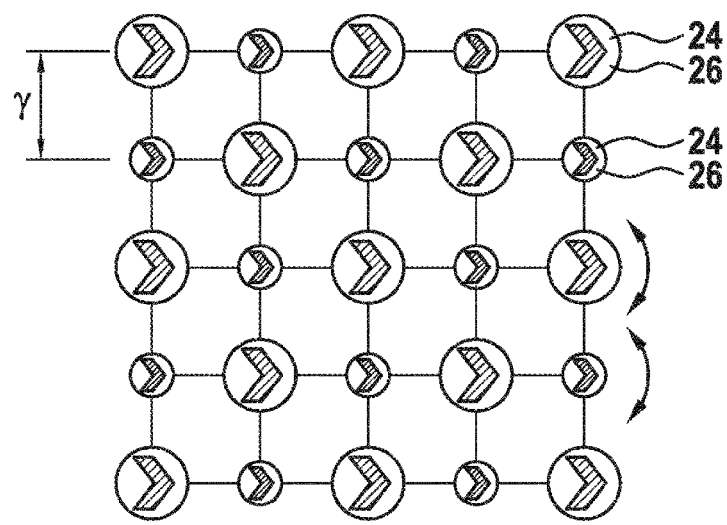
Figure 8D:
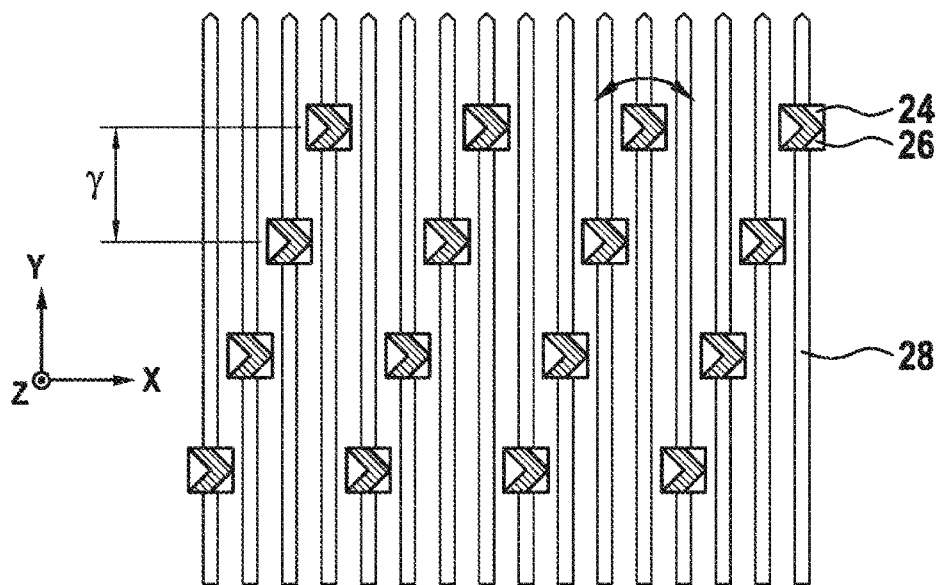
Figure 8E:
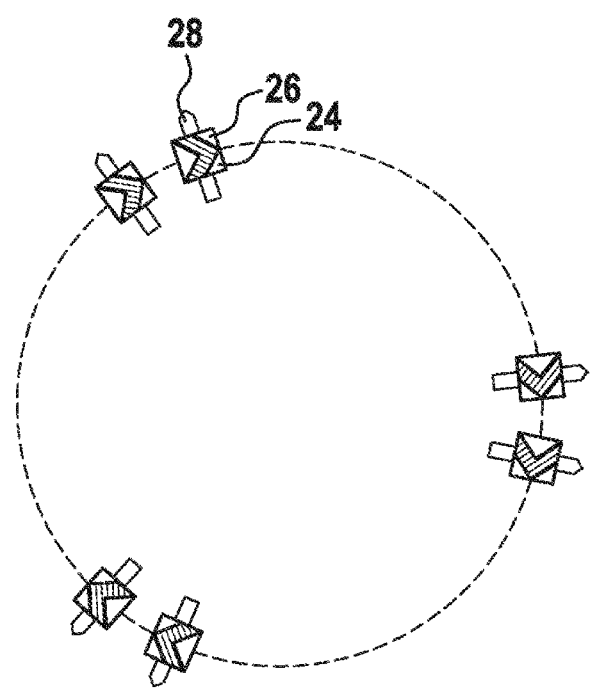

FIGS. 8A to 8E show exemplary arrangements of magnet groups 24 or actuating magnets 26. For example, FIG. 8A shows an arrangement of magnet groups 24 in a rectangular, in particular square pattern. FIG. 8B shows an arrangement of magnet groups 24 in a hexagonal pattern. FIG. 8C shows an exemplary arrangement of different magnet groups 24 in a rectangular pattern. For example, the magnet groups may differ in their magnetic dipole moment. Furthermore, some of the magnet groups may have fast or slow rotation, be connected to the drive via different gear mechanisms, and/or be operated by different drives. Arrangements according to FIGS. 8A to 8C are particularly advantageous if the rotation axes are intended to lie substantially perpendicularly to the arrangement plane. Furthermore, FIGS. 8D and 8E show arrangements in which the magnet groups are connected to the drives via drive shafts 28, wherein the drive shafts run substantially parallel to the action surface 102. According to the arrangement in FIG. 8D, the drive shafts 28 run parallel, while according to the arrangement in FIG. 8E they run at least approximately radially or in circular fashion.

Figure 9A:
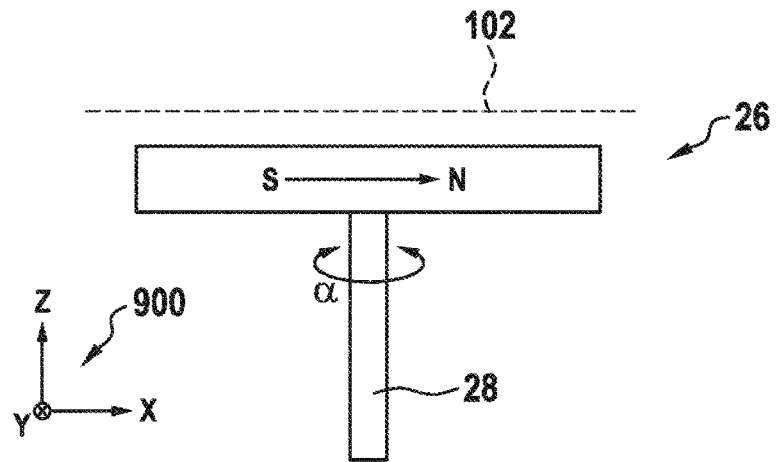
FIGS. 9A to 9H show preferred embodiments of actuating magnets and magnet groups, and preferred arrangements.
Figure 9B:
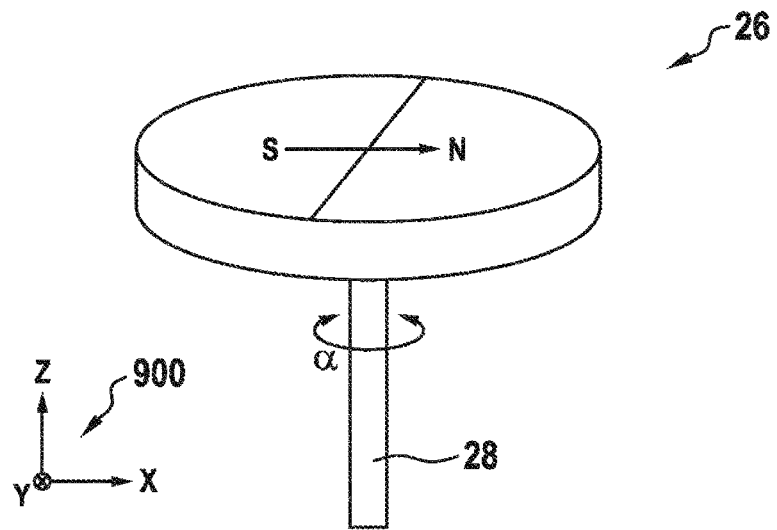
Figure 9C:
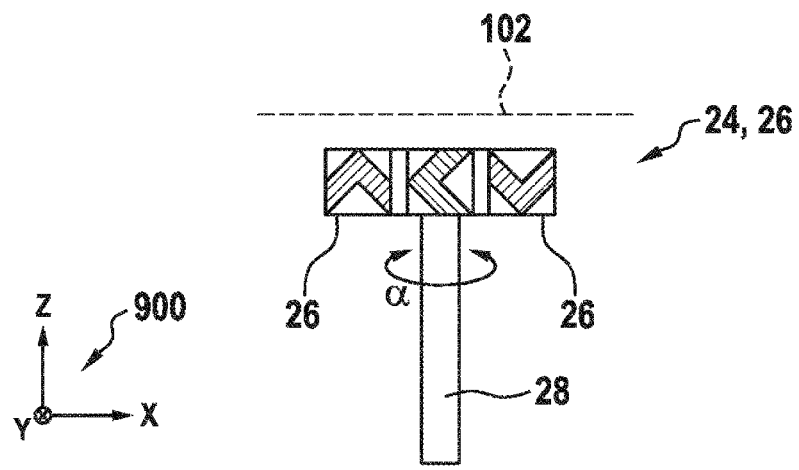
Figure 9D:
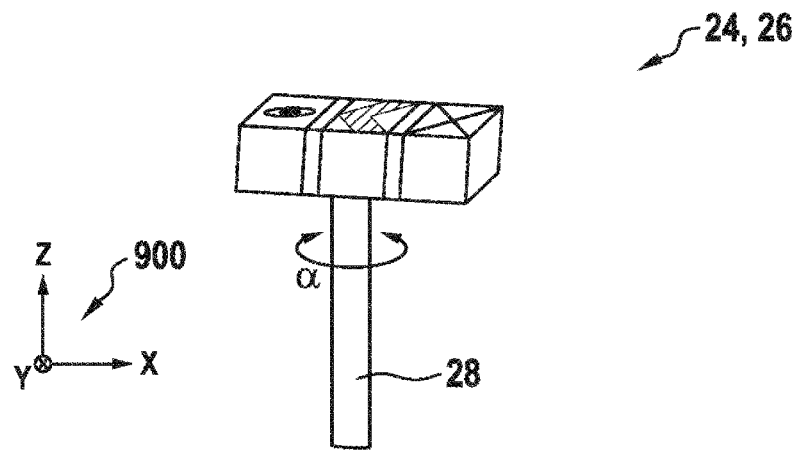

According to a preferred embodiment, an actuating magnet 26 is formed by a single magnet, as shown in FIGS. 9A and 9B, alternatively by an arrangement of several magnets in the magnet group 24, wherein the magnets are preferably mechanically fixedly connected together, as shown in FIGS. 9C and 9D. Alternatively, an actuating magnet 26 may be formed by a magnet group 24 which has several zones of different magnetisation. Preferably, the magnet group 24 forms a Halbach array (see FIGS. 9C and 9D) which is oriented in the direction of the action surface. This offers the advantage that the flux density is increased in the direction of the action surface 102 and reduced in all other directions, in particular in the direction of adjacent magnet groups 24. The actuating magnets 26 or magnet groups 24 shown in FIGS. 9A to 9D are connected to the drive shaft 28 such that the rotation axis of the drive stands perpendicularly to the action surface 102. The angle a here designates the actuation angle of the drive shaft 28 or actuating magnets 26 or magnet group 24.

Figure 9E:
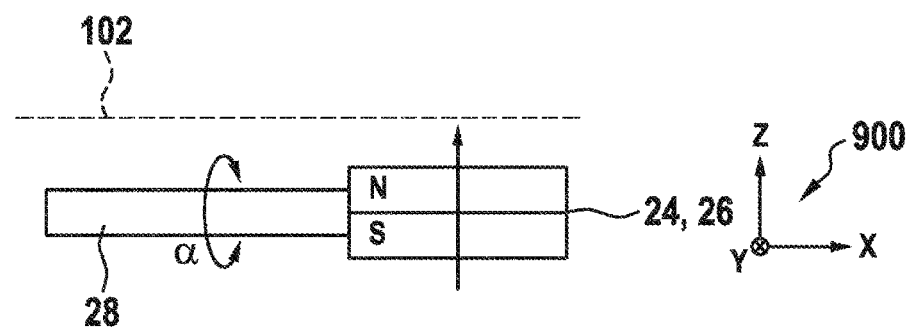
Figure 9F:
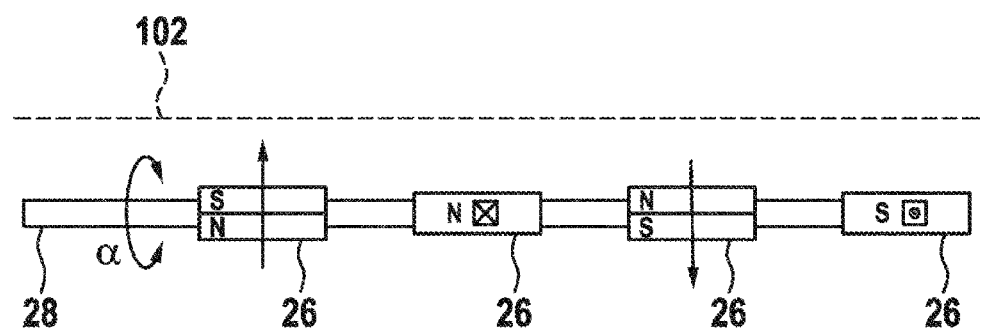

FIGS. 9E and 9F show arrangements in which the actuating magnets 26 or magnet groups 24 are connected to the respective drive shaft 28 such that the drive shafts 28 run substantially parallel to the action surface 102. In such arrangements therefore, the actuating magnets 26 or magnet groups 24 rotate about the X-axis 902.

Figure 9G:
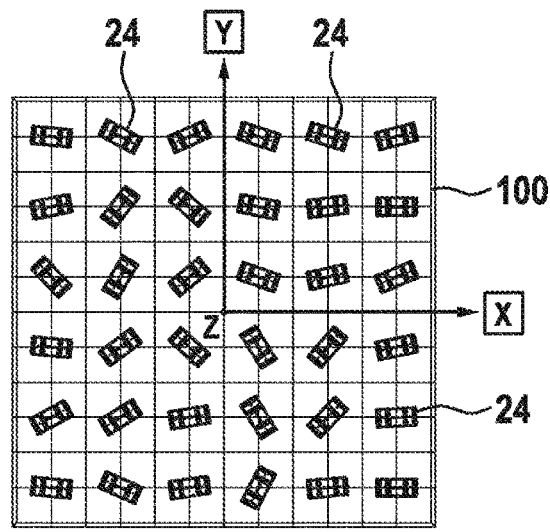
Figure 9H:
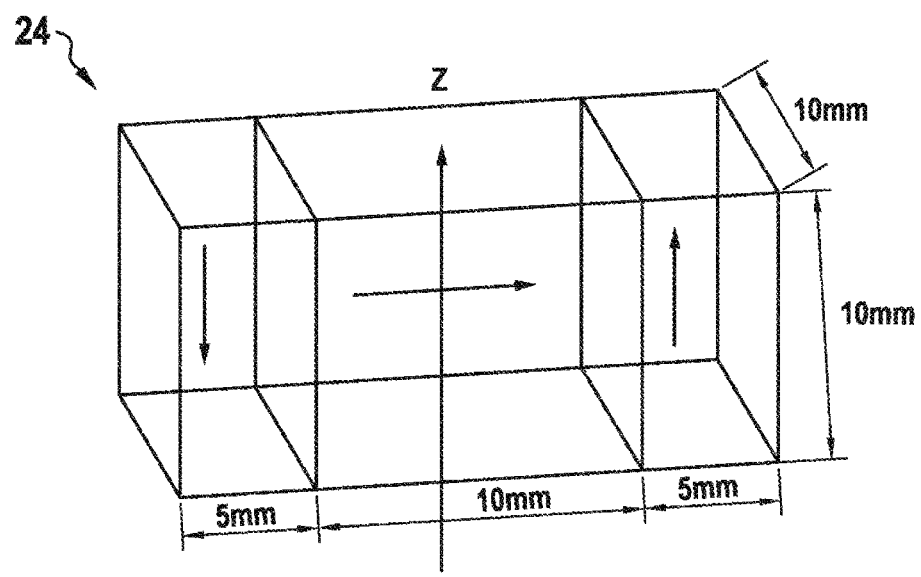

FIG. 9G shows diagrammatically an arrangement, according to a preferred embodiment, of 6×6 magnet groups 24 in a square pattern in a stator 100, wherein the magnet groups 24 are each configured as a Halbach array. FIG. 9H shows a detailed depiction of an individual magnet group 24, in particular with typical dimensions according to a preferred embodiment of such a magnet group 24.

The magnet groups 24 are preferably individually adjustable in the stator 100, i.e. their position and/or orientation may be varied. Preferably, they can execute a linear movement and/or a rotation and/or a superposed movement. Preferably, a rotation is performed about a structurally fixedly predefined rotation axis of the drive shaft 28. In order to achieve an effective change in the magnetic field by rotation, the dominant dipole vector of the magnet group 24 is oriented preferably perpendicularly to the rotation axis of the drive shaft 28.

The rotation axes of the magnet groups 24 may be oriented differently relative to the action surface 102. Preferably, they are oriented perpendicularly and/or parallel to the action surface 102. The distance between adjacent magnet groups 24 is selected such that the torques on the magnet groups 24 caused by their magnetic interaction are low in comparison with typical torques caused by the transport bodies 200.

For the positioning and orientation of the magnet groups 24, actuating elements 114 are used which can preferably execute linear movements and/or rotations and/or superposed movements. An actuating element 114 preferably moves at least one magnet group 24. Preferably, actuating elements 114 are used which can cover an angular range of 360° and are preferably able to execute endless rotations. This may be advantageous for many movements of the transport body 200.

Figure 10A:
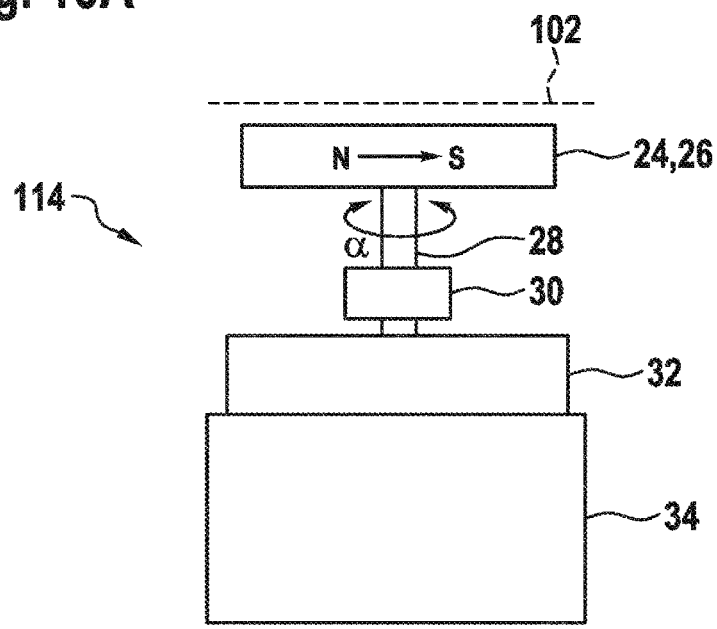
FIGS. 10A and 10B show, in schematic depictions, preferred embodiments of actuating elements.
Figure 10B:
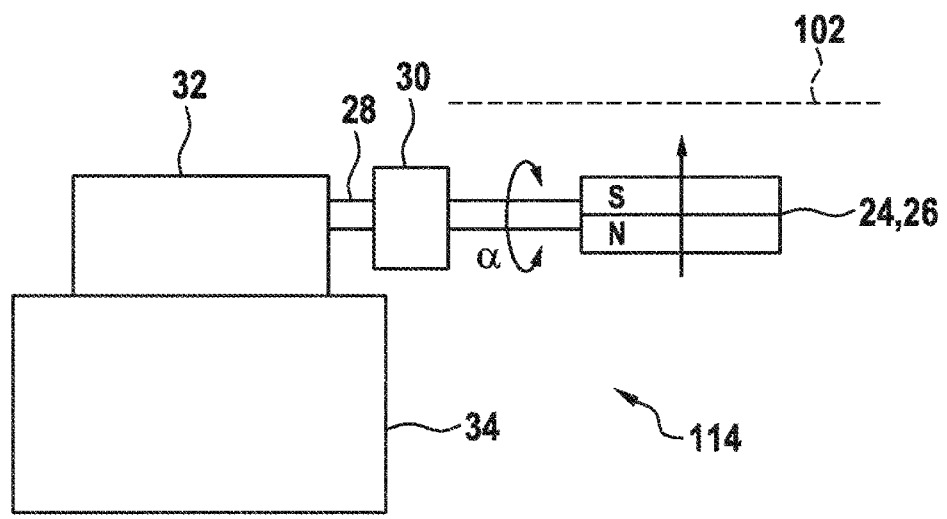

FIGS. 10A and 10B show, in schematic depictions, preferred embodiments of actuating elements 114. Preferably, these have a drive which comprises for example a motor 34, such as an electric motor, which optionally is mechanically connected or coupled to the actuating magnet 26 or magnet group 24 via a gear mechanism 32 and the drive shaft 28. Preferably, the actuating element 114 has a sensor 30 for determining the actuation angle α, and optionally a controller (not shown) which can set or adjust the actuation angle a to a predefined nominal position, preferably quickly and precisely.

For example, an actuating element 114 has an electric motor, with at least one magnet group 24 mounted on its shaft. The sensor 30 measures the rotation angle a of the drive shaft, a PID controller with optional downstream drive amplifier preferably actuates the motor 34. To increase the torque or rotation speed, a gear mechanism 32 may be provided between the motor 34 and the drive shaft 28. The gear mechanism 32 may for example be self-inhibiting so that the motor 34 need not be supplied with power for maintaining a torque in a constant angular position.

The exemplary flat arrangements, shown in FIGS. 8A to 8E, of identical magnet groups 24 in a regular pattern are preferably configured such that each of the magnet groups 24 can be driven or moved by a separate actuating element 114. Here for example, the large and small magnet groups 24 shown in FIG. 8C can be driven by different actuating elements 114, wherein for example large magnet groups 24 are actuated by actuating elements 114 with high torque and high inertia (for example with gears), while small magnet groups 24 are actuated by actuating elements 114 with lower torque and lower inertia.

FIG. 8D shows an exemplary arrangement in which the drive shafts 28 run parallel to the action surface 102 and preferably each drive shaft 28 drives several magnet groups 24.

An actuating element 114 with several drives can preferably influence several degrees of freedom of a magnet group 24. For example, a magnet group 24 mounted universally rotatably in two spatial directions may be rotated by two actuating elements 114 in two different spatial directions.

Instead of electric motors, other drive systems may also be used, for example a lift magnet or a piezo drive.

To achieve a high dynamic, it may be advantageous to rotate the magnet groups 24 about one of their main inertia axes with low inertia moment. The rotation axis preferably runs through the centroid of the respective magnet group 24 in order to avoid vibrations of the stator 100 because of imbalance. In order to compensate for the inertia of the mechanical drives, for example additional coils (see FIGS. 7C and 7D) may be arranged below the action surface 102; said coils are for example able to exert relatively small correction forces and/or moments on the transport body 200 with high dynamic. The action field or levitation field 14 or magnetic field of the stator 100 then results from a superposition of the actuating magnet fields and the coil fields, wherein although the coil fields may indeed be significantly weaker, they can be varied more rapidly.

Since the drives and the drive amplifiers may heat up in operation, a cooling device may be provided which for example cools the drives and/or drive amplifiers by heat dissipation via a cooling body, or a ventilation system and suitable ventilation channels in the stator 100 (see for example FIG. 7B).

Figure 10C:
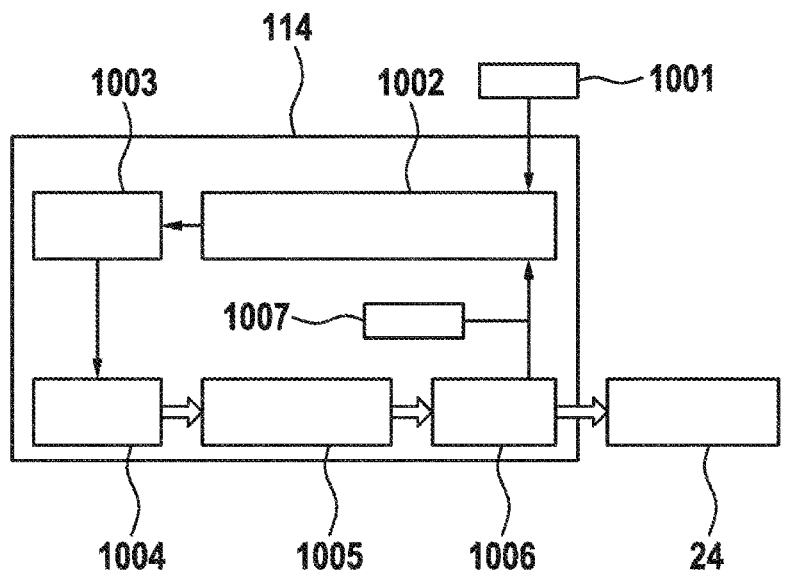
FIG. 10C shows, in a block diagram, an exemplary function principle of an actuating element.

FIG. 10C shows in a block diagram an exemplary function principle of an actuating element 114. Here for example a nominal position 1001 of the respective magnet group 24 is transmitted to a controller 1002. Via a drive amplifier 1003, the drive 1004 can then be actuated such that the magnet group 24 is actuated accordingly, in some cases via a gear mechanism 1005. The actual angular position or actual position 1007 of the magnet group 24 can be determined via a corresponding sensor 1006 and supplied to the position controller again, so that a control loop results, by means of which the magnet group can be positioned and/or oriented as precisely as possible.

Figure 11:
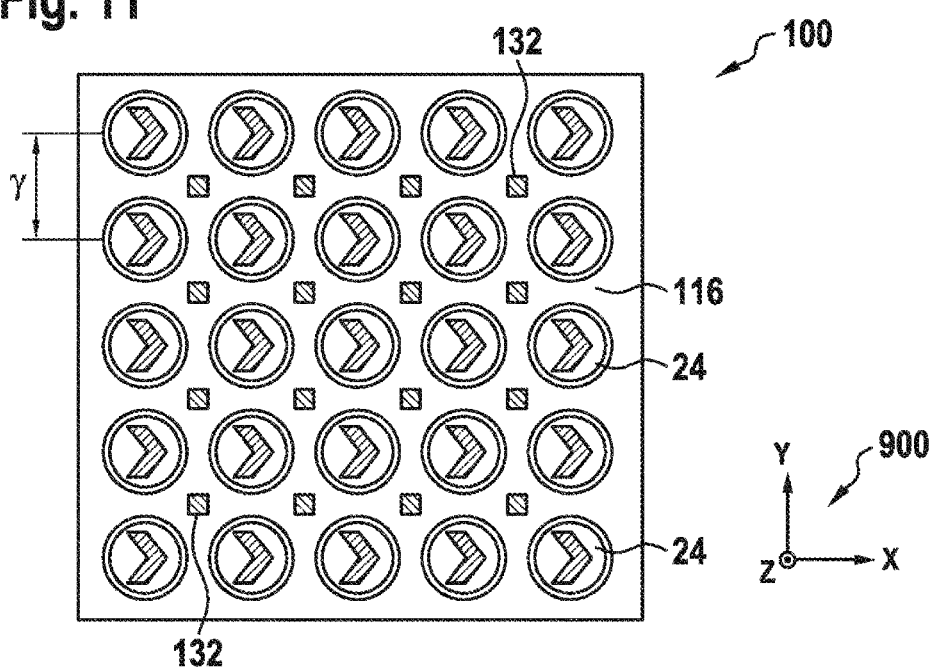
FIG. 11 shows a preferred embodiment of a position determination unit.

According to a further preferred embodiment, the conveying device comprises a position determination unit. This is preferably configured such that the position and/or orientation of the at least one transport body 200 relative to the action surface of the stator 100 can be detected, preferably in cyclic fashion, particularly preferably with high frequency and low latency time. Preferably, all degrees of freedom of the transport body 200 are detected. A measurement may for example constitute the basis for controlling the position of the transport body. FIG. 11 shows a preferred embodiment of a position determination unit which comprises a transport body position determination element 116. For example, the transport body position determination element 116 may be configured as a circuit board which preferably has recesses for the magnet groups 24 or actuating magnets 26, and/or is equipped with sensors 132, wherein the sensors 132 are preferably formed as magnetic field sensors.

The position determination unit may be at least partially integrated in the stator 100 or be installed physically separately from the stator 100 and transmit the position data to a stator controller. Preferably, the position determination unit is however integrated in the stator 100, whereby preferably a constant dimensional reference to the stator 100 can be guaranteed, and/or handling of the entire system can be simplified. Integration in the stator 100 may for example make efficient use of the existing installation space, since the position determination takes place on the side of the transport body 200 which faces the stator 100, and thus preferably the position determination is not obstructed or falsified by the transport product.

Preferably, magnetic field sensors and/or capacitive sensors and/or optical sensors are used as sensors 132. The sensors are preferably arranged in a regular pattern below the action surface 102. For example, Hall sensors may detect the magnetic field in the transport body 200 at several places and/or in different spatial directions. Preferably, all sensor signals are transmitted to a computer system for evaluation. There, for example by means of an algorithm, the actual position of the transport body 200 can be determined from the sensor signals and a modelled description of the magnet arrangements in the transport body 200 and stator 100.

In order to reduce or eliminate the influence of the magnetic fields in the stator 100 on the position determination of the transport body 200, the sensors 132 are preferably mounted as far as possible away from the magnet groups 24 of the stator 100. In addition, magnetic screening devices may be provided which weaken the influence of the magnet groups on the sensors 132 configured as magnetic field sensors. For example, in a single automatic calibration process without the presence of the transport body, the sensor signal from all sensors 132 can be measured as a function of the position of each individual magnet group 24, wherein the measurement values can be permanently stored in a memory of the computer system as a correction table. In operation, for example the raw sensor values may be corrected after each measurement by the error amounts of all magnet groups stored in the correction table, depending on their current position.

According to a further preferred embodiment, an operating interface in the stator 100 provides basic operating and display elements for the device and/or for operation and/or service and/or maintenance. For example, an on/off switch, a reset button and signal lamps for displaying the operating or fault state of the stator 100 may be present. More complex set-up functions are preferably accessible from a higher-level computer system, which for example is connected to the stator 100 via a communication interface.

Preferably, an electronic control system with at least one computer system detects the sensor signals, communicates with the higher-level system, the user interface and in some cases with further stators and system components, and actuates the actuating elements.

Figure 12:
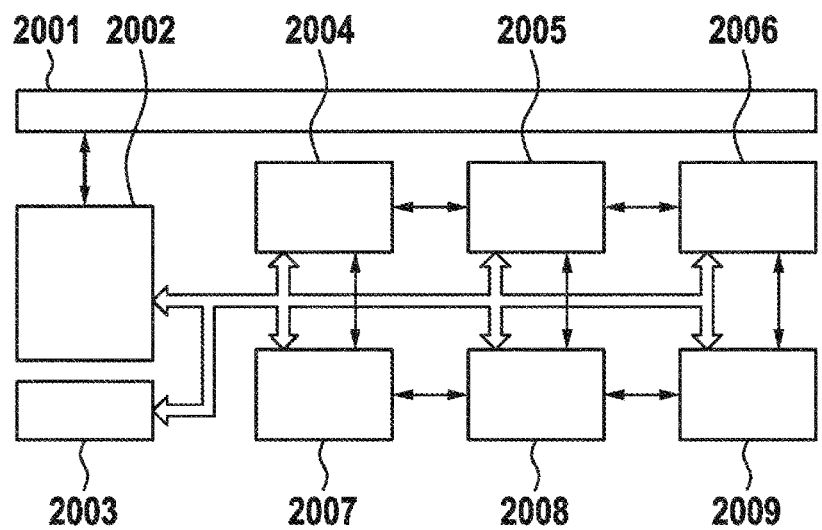
FIG. 12 shows an exemplary control diagram.

Preferably, a computer system is integrated in each stator 100 or in each stator module. When several stators 100 or stator modules are used, their computer systems may be networked for example with bus systems, the topology of which may be extended in flexible fashion. FIG. 12 shows an exemplary control system diagram which comprises the following elements:
2001: Control system of higher-level system
2002: Central control system of conveying device
2003: User interface
2004: Module control system of stator 1
2005: Module control system of stator 2
2006: Module control system of stator 3
2007: Module control system of stator 4
2008: Module control system of stator 5
2009: Module control system of stator 6

The bus systems are able to transmit large data quantities in a short time without latency. The bus systems can transmit the data electrically, optically and/or inductively. For example, adjacent stators 100 or stator modules may have optical transmitters and receivers via which they exchange status information. Further computer systems may be integrated in the bus systems.

According to a preferred embodiment, the method for operating the conveying device 10 may be implemented in the form of algorithms on the at least one computer system. A group of several stators 100 may be treated as a functional unit, so that a transport body 200 is controlled irrespectively of whether it is situated in the influence zone of just one stator 100 or of several stators 100. For this, the computer systems are preferably synchronised on a common time basis.

The at least one computer system preferably provides all functions necessary for set-up and/or safe operation and/or service and maintenance of each stator 100 and a group of several stators 100. For example, integrated self-diagnosis functions permanently monitor correct function, so that a malfunction can be detected and reported immediately and/or substitution measures taken, and the system can if necessary automatically transfer to safe emergency holding.

The conveying device 10 here comprises at least one stator 100 or at least one stator module and at least one transport body 200. Preferably, there are many configuration parameters which can be influenced for adaptation to a target application, e.g. dimensions of the stator 100 for scaling to the size or weight of the transport product, a maximal torque and/or rotation speed and/or inertia moment of the drives, an intensity and/or arrangement of actuating magnets and stationary magnets in the stator 100 or transport body 200, and control parameters.

The arrangement of the magnet groups 24 in the stator 100 is preferably matched to the arrangement of the magnet groups 24 in the transport body 200 such that a transport body 200 with f degrees of freedom can, at every point of its working space, be influenced by the forces and moments of at least f magnet groups 24. In particular, the magnet arrangements are designed such that there are no singularities, i.e. no singular regions in the working space at which this condition is not fulfilled. Exemplary pairings of magnet arrangements in stator and transport body are as follows:

stator as FIG. 8A and transport body as FIG. 4F with $\gamma/\lambda=1/3$.
stator as FIG. 8A and transport body as FIG. 4G with $\gamma/\lambda=1/3$.
stator as FIG. 8A and transport body as FIG. 4I with $\gamma/\lambda=1/3$.
stator as FIG. 8A and transport body as FIG. 4M with $\gamma/2r=1/3$.
stator as FIG. 8B and transport body as FIG. 4F with $\gamma/\lambda=1/3$.
stator as FIG. 8E and transport body as FIG. 4I with $R/r=1$.

Whereas $\lambda$ designates the period length of a Halbach array of stationary magnets 22 or magnet groups 24 of stationary magnets 22, $\gamma$ designates a period length of a regular arrangement of actuating magnets 26 or magnet groups 24 (see for example FIG. 8A).

Preferably, the transport bodies 200 are overdetermined, i.e. they may be influenced by more than f magnet groups 24 simultaneously. The resulting redundancy has advantages such as an improved security against failure. If one magnet group 24 can no longer be effectively controlled, preferably other magnet groups 24 at least partially compensate for the failure so that the position of the transport body 200 can be maintained, albeit possibly with restrictions. The position change necessary for a force/moment change can preferably be divided over several magnet groups 24. This preferably reduces the position change for each individual magnet group 24. Therefore preferably the position change as a whole can be carried out more quickly so that the dynamic of the conveying device 10 increases. Preferably, the forces and moments to be applied for guiding a transport body 200 are divided over several magnet groups 24, so that smaller magnet groups 24 with weaker actuating elements 114 can be used to achieve the same effect. This may bring advantages for energy consumption and the costs of the conveying device 10.

The conveying device can preferably be combined with conventional transfer systems. For example, the transport bodies 200 may be transported over great distances by a conveyor belt in that for example they leave a stator 100, are moved by a conveyor belt to a new position and there transferred to or placed on a stator. As part of a modular overall system, stators 100 with different capacities may be combined. For example, stator modules may be used which are optimised for high speed and/or high precision and/or high forces. These modules are preferably used in zones, wherever they are required.

Figure 13A:
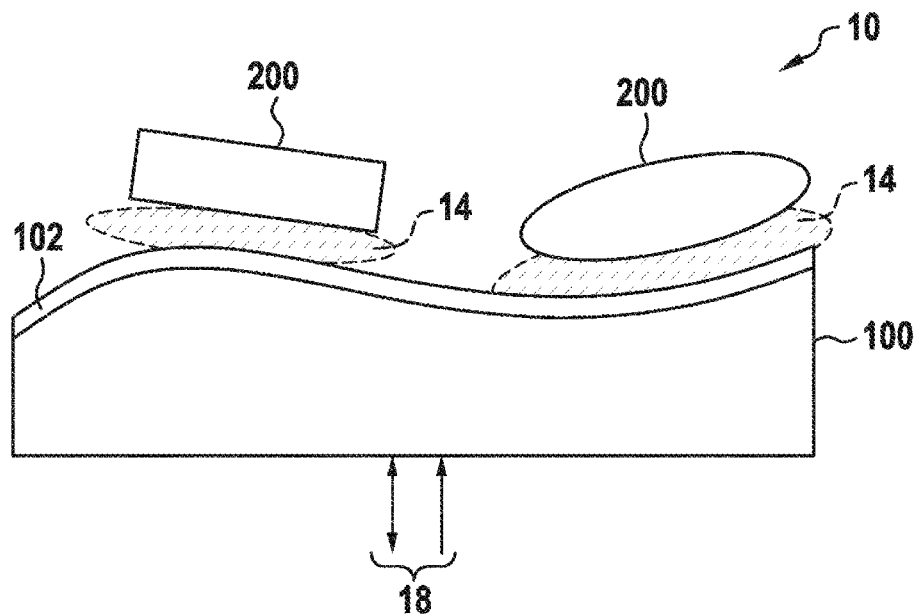
FIGS. 13A to 13C show preferred embodiments of conveying devices.
Figure 13B:
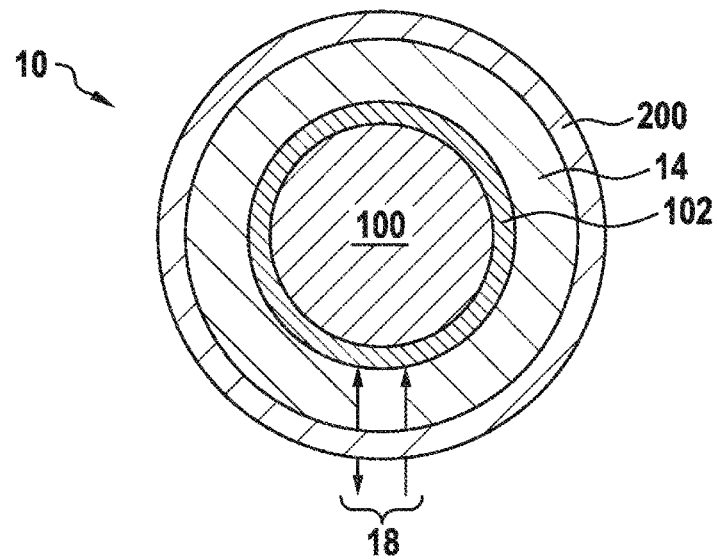
Figure 13C:
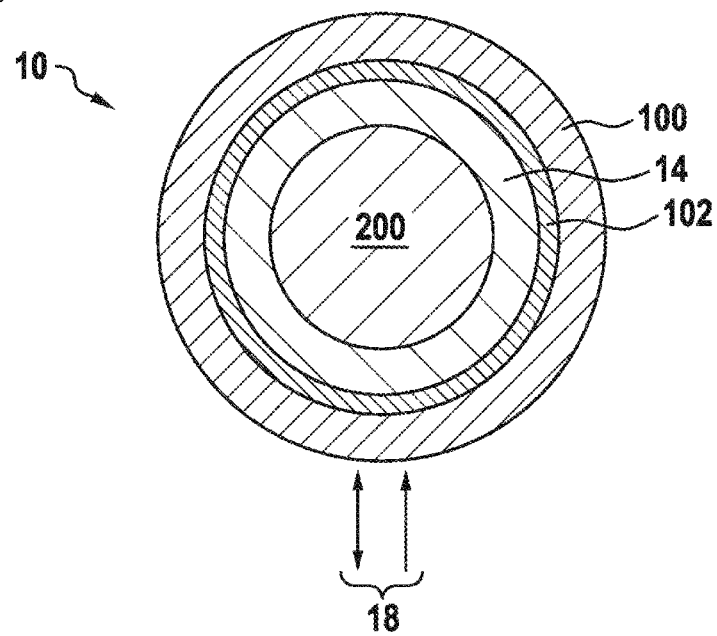

Stators with curved surfaces as shown in FIG. 13A may also be implemented by corresponding arrangement of the magnet groups, for example in round design as shown in FIGS. 13B and 13C, which have an externally or internally guided transport body 200 and a respective internal or external stator 100. For example, such conveying devices may be advantageous for use as a mechanical bearing, for example for rotatable mounting about a shaft.

To save energy, preferably the actuating elements 114 may be operated temporarily with reduced power or switched off when no transport body 200 is in the inclusion zone of the respective magnet group 24. On approach of a transport body 200, they are preferably reactivated briefly.

The outer surfaces of the stator 100 and transport body 200 may preferably be configured such that they are adapted to the respective environmental conditions, for example extreme temperature requirements, high cleanliness requirements, absence of particles, absence of germs, ease of cleaning, resistance to aggressive materials, use in hazardous areas, use under liquid or gaseous atmosphere etc. For this, for example, a wide range of non-ferromagnetic materials is available, such as non-ferrous metals, plastic, Teflon, ceramic, glass, rubber, wood and many more.

A group of transport bodies 200 may preferably perform a task together. For example, several transport bodies moved in synchrony may carry a large load which is too heavy for one transport body 200. Or several transport bodies 200 are connected together for example via a passive parallel kinematic and joints, so that the kinematic can be used as a handling device.

Not all degrees of freedom need necessarily be executed in levitating fashion, but instead individual degrees of freedom may be implemented by a mechanical guide.

For economic implementation of a levitation system with a large transport zone, the stator 100 may preferably be combined with conventional axis systems or vehicles as movement devices. For example, an axis system or vehicle with wheels transports a stator 100 in a large working zone, while the stator 100 itself may position a transport body 200 in a precise and floating fashion in a small working zone.

Optionally, an intermediate level (particle barrier) is present between the stator 100 and transport body 200. The transport body 200 may preferably be situated in the clean zone, while the vehicle is outside. The translational movement function is performed primarily by the vehicle with its classic wheeled drive, and the levitation function and precise positioning by the stator 100 with transport body 200.

Figure 14:
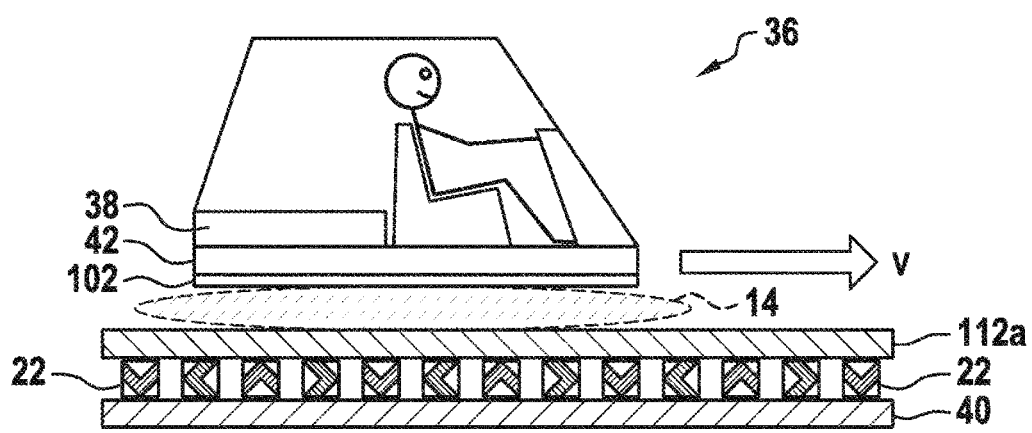
FIG. 14 shows a preferred embodiment of a conveying device.

The action principles of the stator 100 and transport body 200 may be exchanged in other preferred embodiments, so that the stator 100 for example contains an arrangement of stationary magnets 22, and the transport body 200 contains actively movable actuating magnets 26. In this variant for example, the transport body 200 may carry its own energy supply 38 (e.g. accumulator, fuel cell, solar cell) or have an external energy supply (e.g. via a cable). In this way for example, a wafer holder for holding a wafer 36 may be moved by active drive without wheels, in that it comprises a drive 42 with actuating magnets 26 in order for example to travel on a rail or plane attached to the floor 40 and equipped with stationary magnets 22 (see FIG. 14).

On the basis of the conveying device 10 described above, a method according to a preferred embodiment is described below with which the stable magnetic levitation of at least one transport body 200 is achieved, without the disclosure however being restricted to the explained method.

The at least one transport body 200 experiences forces and moments in a dynamically variable magnetic field which is produced by the controlled movement of actuating magnets 26 and at least one stator 100.

To describe the position of the at least one transport body 200, the Cartesian coordinate systems 900 and 920 are used:

Each transport body i has a coordinate system 920i with the axes $(x_i, y_i, z_i)$ and a stationary reference to the transport body; its origin lies for example in the theoretical centre of mass of the magnet arrangement of the transport body.

The stator coordinate system 900 with axes (X, Y, Z) has a stationary reference to the stator. Its X and Y axes lie in the action surface of the stator, while the Z-axis stands perpendicularly on the action surface and points in the direction of the transport body. The position of the transport body with index i is described in the stator coordinate system by the spatial vector $\vec{r}_i$ which indicates the origin of the transport body coordinate system. The angular position of the transport body i is expressed by the vector $\vec{\varphi}_i$, the three components of which give the angles enclosed respectively by the X, Y and Z axes of the coordinate systems of the stator and transport body.

Furthermore, the stator comprises an arrangement of magnet groups which are individually movable relative to the stator in at least one dimension, and the position of which can be changed by actuating elements. It is assumed below that the rotary position or angular position of the magnet group is variable, while the rotation axis in the stator coordinate system is constant and runs through the centre of mass of the magnet group. The actual rotary position of the magnet group k is $\alpha_k$. The control system predefines the nominal angle $\alpha_{k,\,nom}$ which is implemented rapidly and precisely by the controller of the actuating element so that after a short time $\alpha_k = \alpha_{k,\,nom}$.

Figure 15:
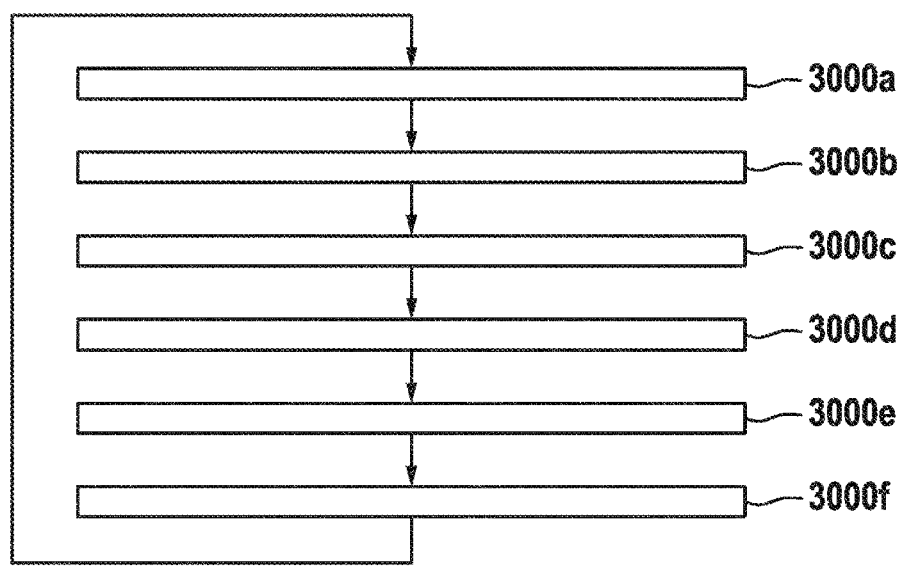
FIG. 15 shows an exemplary process diagram.

According to the preferred embodiment, the method is implemented as a program in the control unit and is run in cyclic fashion with a frequency of 100-10,000 Hz. The function steps of the exemplary loop run-through as depicted as an example in FIG. 15 is described below.

3000a) Determination of the Actual Position and Actual Speed of the Transport Body Magnetic field sensors, capacitive sensors and/or optical sensors are arranged in a regular pattern below the action surface of the stator. The following description is based as an example on Hall sensors. Each Hall sensor measures three magnetic field components in orthogonal directions. The raw sensor values are read by a computer together with the angular position of all magnet groups in the stator. If further stators are adjacent, the measurement values determined there at the same time are transmitted to the stator via a data bus. The entire read process typically takes 0.1 ms-1 ms.

Firstly, measurement values from each sensor are corrected for the influence of the adjacent magnet groups. The field contributions of the adjacent magnet groups were determined once for each sensor in an initialisation run and are stored in correction tables as a function of rotary angle. The correction tables are accessed using the actual read rotary angle of the adjacent magnetic groups. The field contributions of the adjacent magnet groups are subtracted from all raw sensor values. The resulting corrected sensor values represent the flux density of the transport body magnet arrangement over the action surface.

Then the position of the at least one transport body is determined. For this, a description of the magnet arrangement of the transport body is stored as a list in the computer memory. The list contains the positions and dipole vectors of all actuating magnets and/or magnet groups 24 indicated in the transport body coordinate system. Using this list, the field equation for each magnetic dipole and the superposition principle, a computer model of the flux density distribution of the transport body is produced. Using the models, the flux density vectors to be expected at the location of the stator sensors for a predefined transport body position can be calculated. A scalar error function determines a dimension for the error adaptation of the measured and modelled flux densities of all transport bodies and magnet groups. By iterative optimisation of the position and angular position of the transport bodies in the model, the error function is minimised i.e. adapted to the real measurement data. The iteration process ends as soon is no further improvement is achieved and/or the error falls below a predefined error threshold.

The resulting 6D position of the at least one transport body i is interpreted in the context of the accuracy of the model as a real position of the transport body i with spatial vector $\vec{r}_i$ and angular vector $\vec{\varphi}_i$. By numerical differentiation of the cyclic sequence of position values, the actual speed is calculated with the speed vector $\vec{v}_{i,nom}$ for translation and the angular speed vector $\vec{\omega}_{i,nom}$ for rotation.

3000b) Determination of Nominal Position and Nominal Speed of the Transport Body The control system of a higher-level system can determine the desired movement track of the at least one transport body as a result of the 6D nominal positions, nominal times and/or nominal speeds. The track may consist of straight lines, circle portions or other geometric base elements.

The control system interpolates the movement track spatially and temporally. For spatial interpolation, various interpolation methods are considered which are usually applied in robotics: for example linear, spline or polynomial interpolation. For temporal interpolation, the control system breaks down the spatially interpolated track into support points. In each cycle, for each transport body i, it provides the nominal position with spatial vector $\vec{r}_{i,nom}$ and angular vector $\vec{\varphi}_{i,nom}$, and optionally the nominal speed with the speed vector $\vec{v}_{i,nom}$ for translation and the angular speed vector $\vec{\omega}_{i,nom}$ for rotation, and transmits these to the track controller.

3000c) Track Control

The track controller ensures that the actual position of the transport body rapidly and precisely follows the nominal position. For this, the track controller calculates the control deviation, i.e. the difference between the nominal and actual position, and/or the nominal and actual speed, in all 6 dimensions. It uses these as input variables for a control algorithm, for example the PID algorithm, which is calculated separately for each dimension to be controlled. As an output variable, for each transport body i, the track controller supplies the nominal force vector $\vec{F}_{i,nom}$ and the nominal moment vector $\vec{M}_{i,nom}$ which is necessary for correction of the track. The control parameters such as amplification (P), adjustment time (I) and holding time (D), are either determined once and fixedly stored in the control system, or are adapted dynamically to the movement and load state of the transport bodies, such as for example to their total mass or the mass distribution, which can be determined by an observer or by an observation device (see 3000f)).

3000d) Force/Moment Control

For all transport bodies, this program part determines, from the nominal force vectors and nominal moment vectors, the nominal position for all magnet groups which lead to production of the nominal forces and moments. All magnet groups are taken into account which have an influence on the transport bodies to be controlled. For this, the force/moment controller uses a spatial model of the magnet arrangement in the stator and in the at least one transport body. The model is able to calculate approximately the forces and moments which result at a predefined position of the magnet groups. The model contains the magnet arrangement of the transport bodies as a list of positions and dipole vectors of all transport body magnets. It also contains a list of the magnets of each magnet group. The model is used firstly to calculate the partial forces and moments between all magnet pairs, and from this the total force and total moment acting on each transport body are determined. All influences are taken into account as well as possible, for example also the forces and moments mutually exerted between two transport bodies.

Substantially the following equations are used for calculation.

Magnetic field $\vec{B}$ of a magnetic dipole $\vec{\mu}$ at site $\vec{r}$:

$$\vec{B}(\vec{r}) = \frac{\mu_0}{4\pi} \frac{3\vec{r}(\vec{\mu}\vec{r}) - \vec{\mu} r^2}{r^5}$$

with $r=|\vec{r}|$, wherein $\mu_0$ is the magnetic field constant.

Magnetic field $\vec{B}_{ges}$ as superposition of the fields $\vec{B}_i$ (superposition principle)

$$\vec{B}_{ges}(\vec{r}) = \sum_{i=1}^{n} \vec{B}_i(\vec{r})$$

wherein n represents the number of fields to be superposed.

Force $\vec{F}$ on a magnetic dipole $\vec{\mu}$ in field $\vec{B}$:

$$\vec{F} = \vec{\nabla}(\vec{\mu}\vec{B}).$$

The torque $\vec{M}$ which acts on a magnetic dipole $\vec{\mu}$ in field $\vec{B}$:

$$\vec{M} = \vec{\mu} \times \vec{B}$$

The additional torque $\vec{M}_F$ from forces $\vec{F}_i$ which act at a distance $\vec{r}_i$ from the centroid, wherein n represents a number of forces:

$$\vec{M}_F = \sum_{i=1}^{n} \vec{r}_i \times \vec{F}_i$$

By including the actual position of all actuating elements and transport bodies, the model is used to calculate the actual force vector $\vec{F}_i$ and the actual moment vector $\vec{M}_i$ which currently act on each transport body i. The error adjustment between the actual and nominal forces and the actual and nominal moments of all transport bodies is evaluated by a scalar error function E:

$$E = \sum_{i=1}^{m} \left( \frac{|\vec{F}_{i,nom} - \vec{F}_i|}{F_0} \right)^2 + \left( \frac{|\vec{M}_{i,nom} - \vec{M}_i|}{M_0} \right)^2$$

wherein m represents a number of transport bodies, $\vec{F}_i$ and $\vec{M}_i$ the actual force and actual moment respectively, $\vec{F}_{i,nom}$ and $\vec{M}_{i,nom}$ the nominal force and nominal moment, and $F_0$ and $M_0$ the reference force and reference moment.

The lower E is, the better the correlation between the actual and nominal forces and moments of all transport bodies. The error function may be modified or extended by additional terms so that energetically favourable constellations are promoted. Thus the behaviour of the entire system can be optimised for example for minimal power consumption, minimal position change of magnet groups, or minimal number of magnet groups involved in a position change.

In an iterative optimisation process, the positions of the magnet groups in the model are changed in stages. After each step, the forces and moments are recalculated in the model and evaluated with the error function. Steps which lead to a reduction in the error E are retained and form the basis for the next iteration step. As soon as the error cannot be reduced further and/or falls below a predefined threshold, and/or a predefined number of iteration steps as been performed, the optimisation loop is ended.

3000e) Output of Nominal Positions to Actuating Elements

The positions of the magnet groups which have been optimised in the model are output to the actuating elements as nominal specifications.

3000f) Observer for Determining the Movement Parameters (Optional)

An algorithm described as an "observer" detects the temporal development of the actual position of the magnet groups and transport bodies as a reaction to this. It uses the information to determine the movement parameters of the transport bodies using an extended model. The extended model is based on the force/moment model described above and is supplemented by further physical variables which describe the movement state of the transport body, for example mass, damping, centre of gravity, gravity vector, inertia sensor or inertial acceleration. In addition, the model calculates the movement equations of the transport bodies both in translation and rotation.

Since the movement parameters are not known a priori, their value is initially estimated and then optimised by targeted parameter variation in an iterative calculation of the model. For evaluation of the error adaptation, a scalar error function is applied which evaluates the deviation of the modelled track curve from the measured track curve over the period of the last measurements.

This results in approximate values for the above-mentioned movement parameters. These may be used e.g. within the control system to optimise the control parameters such as P, I, D. For example, the total weight m of the transport body with load may be determined and used in the track controller as a factor in the calculation of the nominal forces and moments, so that for double the weight, the doubled forces and moments are output to the transport body, and hence the acceleration a=F/m is independent of mass. The movement parameters may also be output as status information to the higher-level system (FIG. 16) so that this can for example conclude the load status from the weight of the transport body and thereby implement a process control. For example, the conveying device may have a load detection device for detecting a load state or total mass of the transport body. In another example, a shift of the centre of gravity, for example on transport of a sloshing fluid, may be actively adjusted out so that open containers with fluid can be transported rapidly and reliably.

One or more of the following advantageous embodiments may also contribute to refining the conveying device (10) proposed here, according to which in particular:

the at least two stationary magnets (22) comprise
    two stationary magnets (22) which are arranged on a straight line, wherein a dipole moment of at least one of the stationary magnets is not oriented parallel to this straight line, or
    three or more stationary magnets (22);

the at least two stationary magnets (22) and/or the several actuating magnets (26) each comprise at least one permanent magnet;

the at least one permanent magnet has a magnetic flux density of at least 0.05 T, preferably at least 0.1 T, further preferably at least 0.25 T, even further preferably at least 0.5 T, particularly preferably at least 0.75 T, most preferably at least 1 T;

the several actuating magnets (26) each comprise a magnet group (24), and/or the at least two stationary magnets (22) are arranged in a magnet group (24), wherein preferably each actuating magnet (26) comprises a magnet group (24), and/or wherein preferably each actuating magnet (26) comprises a magnet group (24), and wherein each magnet group comprises a plurality of permanent magnets and/or magnetic coils;

the plurality of permanent magnets and/or magnetic coils of the at least one magnet group (24) are arranged according to at least one Halbach array such that a magnetic field of the magnet group (24) preferably extends towards the conveying surface;

the actuating element (114) comprises a drive element which is configured to change the position and/or orientation of the connected actuating magnet (26) in controlled fashion; and/or wherein the actuating element (114) comprises a sensor element which is configured to determine the position and/or orientation of the actuating magnet (26) connected to the actuating element (114); and/or wherein the actuating element (114) comprises a control element which is configured to adjust the position and/or orientation of the actuating magnet (26) connected to the actuating element (114) to a predefined value by means of the drive;

the conveying device (10) furthermore comprises a position determination unit which is configured to determine a relative position and/or orientation of the at least one transport body (200) relative to the stator (100);

the conveying device (10) furthermore comprises a movement device which is configured to move the stator relative to an environment;

the transport body (200) or the stator comprises an energy store;

the at least one transport body (200) has at least one internal degree of freedom, and preferably in total more than six degrees of freedom;

the stator (100) and/or the transport body (200) furthermore comprise a cover (112a) which is configured to limit the forces acting between the stator (100) and the transport body (200);

the stationary magnets (22) are arranged as two-dimensional Halbach arrays and in particular have a rectangular and/or square and/or hexagonal and/or circular arrangement;

the stationary magnets (22) in the transport body (200) are arranged at least partially in the form of a cylinder and/or ball, such that they have a greater pivot range than transport bodies (200) with a flat arrangement of stationary magnets (22);

the at least one transport body (200) has an identification element, and the conveying device (10) is configured to identify the transport body (200) from the identification element;

the stator comprises several stator modules which are preferably arranged adjacent to each other;

the actuating elements (114) are configured as rotary actuators which in particular have a rotation axis perpendicular to an action surface (102) of the stator (100);

the stator (100) has a curved action surface (102);

a number of degrees of freedom of the actuating magnets (26) is at least as great as a number of degrees of freedom along which the at least one transport body (200) is to be conveyed and/or positioned in controlled fashion;

the conveying device (10) is configured as a contactless mechanical bearing;

the conveying device is configured to fix the at least one transport body to the at least one stator in the event of an interruption in the power supply;

the conveying device (10) furthermore comprises a load detection device which is configured to determine a load state of the transport body;

the conveying device (10) furthermore contains an observation device which is configured to determine a mass and/or a centre of gravity of the transport body (200) relative to the stator (100).

One or more of the following advantageous embodiments may contribute to refining the method proposed here, according to which in particular:

the actuating elements (114) are actuated such that the at least one transport body (200) assumes a desired position and/or orientation relative to the stator (100);

the desired position and/or orientation has six degrees of freedom;

the step of actuating the actuating elements (114) such that the at least one transport body (200) assumes a desired position and/or orientation relative to the stator (100) comprises:

determining an actual position and/or actual speed of the transport body (200) relative to the stator (100);

determining a nominal position and/or a nominal speed of the transport body (200) relative to the stator (100);

establishing a deviation of the actual position and/or actual speed from the nominal position and/or nominal speed;

calculating nominal settings of at least some of the actuating magnets (26) such that the respective actuating magnets (26) act towards a reduction of the deviation of the nominal position and/or nominal speed from the actual position and/or actual speed of the transport body;

arranging the respective actuating magnets (26) by means of the actuating elements (114) such that the respective actuating magnets assume the nominal settings.

The invention claimed is:

1. A conveying device for conveying at least one wafer, comprising:
at least one transport body configured at least to carry or hold the at least one wafer; and
a stator, relative to which the conveying device is configured to convey the at least one transport body at least two-dimensionally on a conveying surface in controlled fashion, wherein:
the stator comprises several movably arranged actuating magnets, each of which is connected to the stator via an actuating element, wherein the actuating element is configured to change a position and/or an orientation of the connected actuating magnets relative to the stator in controlled fashion;
the at least one transport body comprises at least two stationary magnets which are connected to the transport body such that the at least two stationary magnets are immovable relative to the transport body;
the stator and the at least one transport body are magnetically coupled by means of the at least two stationary magnets and the several actuating magnets; and
the conveying device is configured to convey the at least one transport body relative to the stator by controlled positioning and/or orientation of the several actuating magnets via the actuating elements.

2. The conveying device according to claim 1, wherein the conveying device is configured to convey the at least one transport body in a controlled floating fashion.

3. The conveying device according to claim 1, wherein the conveying device is configured to levitate the at least one transport body relative to the stator via the several actuating magnets and the at least two stationary magnets.

4. The conveying device according to claim 1, further comprising:
at least one slit valve fixedly positioned relative to the conveying surface, and configured to allow at least a portion of the wafer carried or held by the at least one transport body therethrough while precluding at least a portion of the at least one transport body from passing therethrough.

5. The conveying device according to claim 1, wherein the several actuating magnets and/or the at least two stationary magnets are arranged facing the conveying surface, wherein the conveying device is configured to convey the at least one transport body relative to the stator along the conveying surface in controlled fashion.

6. The conveying device according to claim 1, wherein the at least one transport body include at least two transport bodies, and the conveying device is configured to convey the at least two transport bodies along different conveying paths on the conveying surface such that one transport body of the at least two transport bodies can overtake another transport body of the at least two transport bodies.

7. The conveying device according to claim 1, wherein the at least one transport body include at least two transport bodies, and the conveying device is configured to convey the at least two transport bodies along a conveying path having at least two tracks on the conveying surface.

8. The conveying device according to claim 1, wherein the conveying device is configured to convey the at least one transport body at least up to a processing station, or to at least position or align the at least one wafer transported by the at least one transport body in the processing station.

9. A conveying device for conveying at least one wafer, comprising:
- at least one transport body configured at least to carry or hold the at least one wafer; and
- a stator, relative to which the conveying device is configured to convey the at least one transport body at least two-dimensionally on a conveying surface in controlled fashion, wherein:
- the at least one transport body comprises several movably arranged actuating magnets, each of which is connected to the transport body via an actuating element, wherein the actuating element is configured to change a position and/or an orientation of the connected actuating magnet relative to the transport body in controlled fashion;
- the stator comprises at least two stationary magnets which are connected to the stator such that the at least two stationary magnets are immovable relative to the stator;
- the at least one transport body and the stator are magnetically coupled by means of the at least two stationary magnets and the several actuating magnets; and
- the conveying device is configured to convey the at least one transport body relative to the stator by controlled positioning and/or orientation of the several actuating magnets by means of the actuating elements.

10. The conveying device according to claim 9, further comprising:
- at least one slit valve fixedly positioned relative to the conveying surface, and configured to allow at least a portion of the wafer carried or held by the at least one transport body therethrough while precluding at least a portion of the at least one transport body from passing therethrough.

11. The conveying device according to claim 9, wherein the several actuating magnets and/or the at least two stationary magnets are arranged facing the conveying surface, wherein the conveying device is configured to convey the at least one transport body relative to the stator along the conveying surface in controlled fashion.

12. The conveying device according to claim 9, wherein the conveying device is configured to levitate the at least one transport body relative to the stator via the several actuating magnets and the at least two stationary magnets.

13. A method for operating a conveying device, comprising:
- freely moving at least one transport body, which is configured to carry or hold at least one wafer, on a conveying surface into a desired position and/or orientation with the conveying device, which is configured to move the at least one transport body at least two-dimensionally on the conveying surface using a stator, relative to which the conveying device is configured to convey the at least one transport body in controlled fashion, wherein:
- one of the at least one transport body and the stator comprises several movably arranged actuating magnets, each of which is connected to the one of the at least one transport body and the stator via an actuating element, wherein the actuating element is configured to change a position and/or an orientation of the connected actuating magnet relative to the at least one transport body and the stator in controlled fashion;
- the other of the at least one transport body and the stator comprises at least two stationary magnets which are connected to the other of the at least one transport body and the stator such that the at least two stationary magnets are immovable relative to the other of the at least one transport body and the stator;
- the at least one transport body and the stator are magnetically coupled by means of the at least two stationary magnets and the several actuating magnets; and
- the conveying device is configured to freely move the at least one transport body relative to the stator by controlled positioning and/or orientation of the several actuating magnets by means of the actuating elements.

14. The method of claim 13, further comprising:
- moving at least a portion of the wafer carried or held by the at least one transport body through a slit valve; and
- precluding, with the slit valve, at least a portion of the at least one transport body from passing through the slit valve after moving the at least a portion of the wafer through the slit valve.

\* \* \* \* \*